United States Patent
Edwards et al.

(10) Patent No.: US 7,683,364 B2
(45) Date of Patent: Mar. 23, 2010

(54) GATED QUANTUM RESONANT TUNNELING DIODE USING CMOS TRANSISTOR WITH MODIFIED POCKET AND LDD IMPLANTS

(75) Inventors: Henry Litzmann Edwards, Garland, TX (US); Chris Bowen, Lucas, TX (US); Tathagata Chatterjee, Allen, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 12/204,604

(22) Filed: Sep. 4, 2008

(65) Prior Publication Data

US 2009/0057651 A1 Mar. 5, 2009

Related U.S. Application Data

(60) Provisional application No. 60/969,772, filed on Sep. 4, 2007.

(51) Int. Cl.
*H01L 29/88* (2006.01)
*H01L 29/775* (2006.01)
*H01L 21/336* (2006.01)

(52) U.S. Cl. .......... 257/24; 257/25; 257/E29.042; 257/E29.34; 257/E21.395; 438/290

(58) Field of Classification Search .......... 257/24, 257/25, E29.042, E29.34, E21.395; 438/290
See application file for complete search history.

(56) References Cited

U.S. PATENT DOCUMENTS

| 5,093,699 | A | * | 3/1992 | Weichold et al. | 257/192 |
| 5,686,739 | A | * | 11/1997 | Baba | 257/105 |
| 6,291,832 | B1 | * | 9/2001 | Krivokapic | 257/25 |
| 2005/0056827 | A1 | * | 3/2005 | Li et al. | 257/25 |

* cited by examiner

*Primary Examiner*—Evan Pert
(74) *Attorney, Agent, or Firm*—John J. Patti; Wade J. Brady, III; Frederick J. Telecky, Jr.

(57) ABSTRACT

A gated resonant tunneling diode (GRTD) is disclosed including a metal oxide semiconductor (MOS) gate over a gate dielectric layer which is biased to form an inversion layer between two barrier regions, resulting in a quantum well less than 15 nanometers wide. Source and drain regions adjacent to the barrier regions control current flow in and out of the quantum well. The GRTD may be integrated in CMOS ICs as a quantum dot or a quantum wire device. The GRTD may be operated in a negative conductance mode, in a charge pump mode and in a radiative emission mode.

18 Claims, 26 Drawing Sheets

US 7,683,364 B2

GATED QUANTUM RESONANT TUNNELING DIODE USING CMOS TRANSISTOR WITH MODIFIED POCKET AND LDD IMPLANTS

FIELD OF THE INVENTION

This invention relates to the field of integrated circuits. More particularly, this invention relates to methods to incorporate gated resonant tunneling diodes into CMOS integrated circuits.

BACKGROUND OF THE INVENTION

Resonant tunneling diodes, which are typically based on quantum wells, provide several desirable modes of operation for complementary metal oxide semiconductor (CMOS) integrated circuits (ICs), including negative resistance, precision charge pumping and radiative emission. Integrating quantum well resonant tunneling diodes in silicon integrated circuits which allow operation at room temperature has been problematic.

SUMMARY OF THE INVENTION

This Summary is provided to comply with 37 C.F.R. §1.73, requiring a summary of the invention briefly indicating the nature and substance of the invention. It is submitted with the understanding that it will not be used to interpret or limit the scope or meaning of the claims.

The instant invention provides a gated resonant tunneling diode (GRTD) which features a metal oxide semiconductor (MOS) gate to control a depth of a quantum well between two barrier regions. The GRTD may be integrated in complementary metal oxide semiconductor (CMOS) integrated circuits (ICs) with various embodiments. The quantum well may be configured as a quantum dot or a quantum wire. The GRTD may be operated in a negative conductance mode, in a charge pump mode and in a radiative emission mode.

DETAILED DESCRIPTION

Figure 1A:
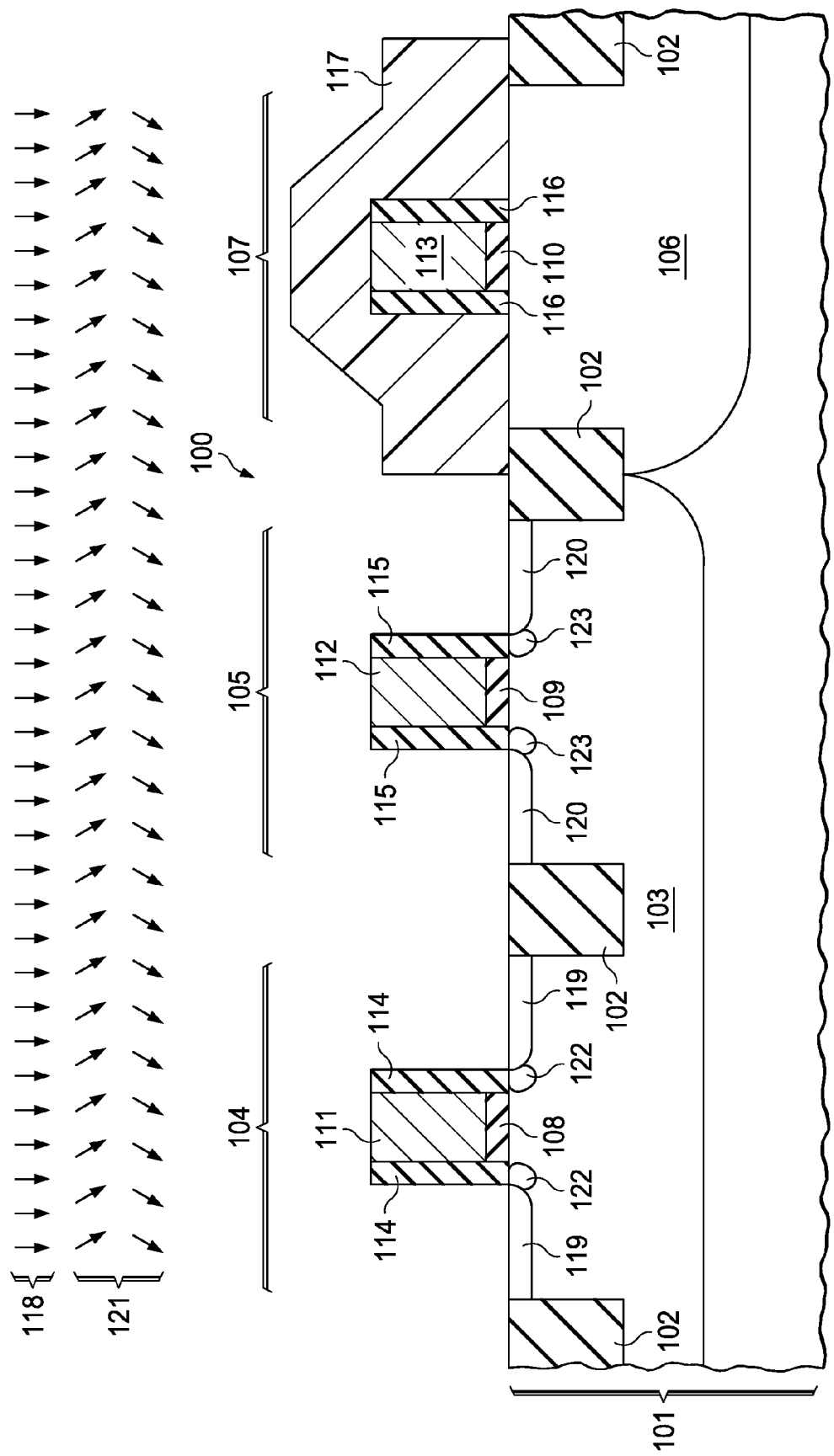
FIG. 1A through FIG. 1D are cross-sections of a CMOS IC including a GRTD formed according to an embodiment of the instant invention, depicted in successive stages of fabrication.

The present invention is described with reference to the attached figures, wherein like reference numerals are used throughout the figures to designate similar or equivalent elements. The figures are not drawn to scale and they are provided merely to illustrate the invention. Several aspects of the invention are described below with reference to example applications for illustration. It should be understood that numerous specific details, relationships, and methods are set forth to provide a full understanding of the invention. One skilled in the relevant art, however, will readily recognize that the invention can be practiced without one or more of the specific details or with other methods. In other instances, well-known structures or operations are not shown in detail to avoid obscuring the invention. The present invention is not limited by the illustrated ordering of acts or events, as some acts may occur in different orders and/or concurrently with other acts or events. Furthermore, not all illustrated acts or events are required to implement a methodology in accordance with the present invention.

The instant invention provides a gated resonant tunneling diode (GRTD) which features a metal oxide semiconductor (MOS) gate to control a depth of a quantum well between two barriers. The GRTD may be integrated in complementary metal oxide semiconductor (CMOS) integrated circuits (ICs) with various embodiments. Some embodiments add no fabrication steps or process complexity, while other embodiments require one or two extra ion implant steps.

The term "meV" is understood to mean milli-electron volts. 1 meV is approximately equal to $1.6 \cdot 10^{-22}$ joules.

FIG. 1A through FIG. 1D are cross-sections of a CMOS IC including a GRTD formed according to an embodiment of the instant invention, depicted in successive stages of fabrication. Referring to FIG. 1A, the CMOS IC (100) is formed in a semiconductor substrate (101), typically p-type single crystal silicon, less commonly a silicon-on-insulator (SOI) substrate or a hybrid orientation technology (HOT) substrate with regions of silicon or silicon-germanium with different crystal orientations. It is within the scope of the instant invention to form the GRTD in any substrate which supports fabrication of a CMOS IC. Elements of field oxide (102) are formed by a shallow trench isolation (STI) process sequence, in which trenches, commonly 200 to 500 nanometers deep, are etched into the substrate (101), electrically passivated, commonly by growing a thermal oxide layer on sidewalls of the trenches, and filled with insulating material, typically silicon dioxide, commonly by a high density plasma (HDP) process or an ozone based thermal chemical vapor deposition (CVD) process, also known as a high aspect ratio process (HARP). A p-type well (103), commonly called a p-well, is formed in the substrate (101), typically by ion implanting a p-well set of p-type dopants, including boron and possibly gallium and/or indium, at doses from $1 \cdot 10^{11}$ to $1 \cdot 10^{14}$ atoms/cm$^2$, into a region defined for an n-channel metal oxide semiconductor (NMOS) transistor (104) and a region defined for the GRTD (105). A p-well photoresist pattern, not shown in FIG. 1A for clarity, is commonly used to block the p-well set of p-type dopants from areas outside the p-well (103). The p-well (103) extends from a top surface of the substrate (101) to a depth typically 50 to 500 nanometers below a bottom surface of the field oxide elements (102). The ion implantation process to form the p-well (103) may include additional steps to implant additional p-type dopants at shallower depths for purposes of improving NMOS transistor performance, such as threshold adjustment, leakage current reduction and suppression of parasitic bipolar operation. An n-type well (106), commonly called an n-well, is formed in the substrate (101), typically by ion implanting an n-well set of n-type dopants, including phosphorus and arsenic, and possibly antimony, at doses from $1 \cdot 10^{11}$ to $1 \cdot 10^{14}$ atoms/cm$^2$, into a region defined for a p-channel metal oxide semiconductor (PMOS) transistor (107). An n-well photoresist pattern, not shown in FIG. 1A for clarity, is commonly used to block the n-well set of n-type dopants from areas outside the n-well (106). The n-well (106) extends from the top surface of the substrate (101) to a depth typically 50 to 500 nanometers below the bottom surface of the field oxide elements (102). The ion implantation process to form the n-well (106) may include additional steps to implant additional n-type dopants at shallower depths for purposes of improving PMOS transistor performance, such as threshold adjustment, leakage current reduction and suppression of parasitic bipolar operation. A sheet resistivity of the n-well (106) is commonly between 100 and 1000 ohms/square.

Still referring to FIG. 1A, an NMOS gate dielectric layer (108), typically silicon dioxide, nitrogen doped silicon dioxide, silicon oxy-nitride, hafnium oxide, layers of silicon dioxide and silicon nitride, or other insulating material, between 1 and 30 nanometers thick, is formed on a top surface of the p-well (103) in the NMOS transistor region (104) by known methods. Similarly, a GRTD gate dielectric layer (109) and a PMOS gate dielectric layer (110), both typically including the same material as the NMOS gate dielectric layer (108), are formed on a top surface of the p-well (103) in the GRTD region (105) and on a top surface of the n-well (106) in the PMOS transistor region (107), respectively. It is common to form portions or all of the NMOS gate dielectric layer (108), GRTD gate dielectric layer (109) and PMOS gate dielectric layer (110) concurrently. An NMOS gate (111) is formed on a top surface of the NMOS gate dielectric layer (108). At this stage of fabrication of the IC (100), the NMOS gate (111) is typically formed of polycrystalline silicon, commonly known as polysilicon, by depositing a layer of polysilicon on the top surface of the NMOS gate dielectric layer (108), forming a gate photoresist pattern to define areas for the NMOS gate (111), followed by removal of unwanted polysilicon by known etching methods. Similarly, a GRTD gate (112) is formed on a top surface of the GRTD dielectric layer (109) and a PMOS gate (113) is formed on a top surface of the PMOS gate dielectric layer (110), typically during formation of the NMOS gate (111). NMOS offset spacers (114), typically silicon dioxide or a layer of silicon dioxide and a layer of silicon nitride, between 1 and 10 nanometers thick, are formed on lateral surfaces of the NMOS gate (111), commonly by oxidation of the polysilicon in the NMOS gate (111) and possible conformal deposition of silicon dioxide and/or silicon nitride. Similarly, GRTD offset spacers (115), also typically silicon dioxide or a layer of silicon dioxide and a layer of silicon nitride, between 1 and 10 nanometers thick, are formed on lateral surfaces of the GRTD gate (112), and PMOS offset spacers (116), also typically silicon dioxide or layer of silicon dioxide and a layer of silicon nitride, between 2 and 15 nanometers thick, are formed on lateral surfaces of the PMOS gate (113). It is common for the PMOS offset spacers (116) to have a different thickness than the NMOS offset spacers (114). The GRTD offset spacers (115) may have a different thickness from either the NMOS offset spacers (114) or the PMOS offset spacers (116).

Continuing to refer to FIG. 1A, an n-type lightly doped drain (NLDD) photoresist pattern (117) is formed on top surfaces of the n-well (106) and PMOS gate (113), using known photolithographic methods. An NLDD set of n-type dopants (118), typically phosphorus and arsenic, and possibly antimony, is ion implanted into a top layer of the p-well (103) adjacent to the NMOS offset spacers (114) and adjacent to the GRTD offset spacers (115), at a total dose typically between $1 \cdot 10^{13}$ and $5 \cdot 10^{14}$ atoms/cm$^2$, to a depth in the p-well (103) between 10 and 50 nanometers, to form NLDD implanted regions (119) in the NMOS transistor region (104) and GRTD lightly doped drain (LDD) implanted regions (120) in the GRTD region (105). The NLDD photoresist pattern (117) blocks the NLDD set of n-type dopants (118) from areas where the NLDD set of n-type dopants is not desired, for example, areas defined for PMOS transistors. While the NLDD photoresist pattern (117) is in place, an NMOS halo set of p-type dopants (121), typically boron, a portion of which is commonly in the form BF$_2$, and possibly gallium or indium, is ion implanted into the top layer of the p-well (103), typically at a total dose between $1 \cdot 10^{12}$ and $3 \cdot 10^{13}$ atoms/cm$^2$, to form p-type NMOS halo implanted regions (122) laterally abutting the NLDD implanted regions (119) and GRTD halo implanted regions (123) laterally abutting the GRTD LDD implanted regions (120). The NMOS halo set of p-type dopants (121) is typically ion implanted in two or four subdoses, wherein each subdose is ion implanted at an angle of 10 to 30 degrees from a vertical axis of the IC (100), and rotated about the vertical axis to provide a uniform concentration of p-type dopants in the NMOS halo implanted regions (122) on all sides of the NMOS gate (111) and in the GRTD halo implanted regions (123) on all sides of the GRTD gate (112). The NLDD photoresist pattern (117) is removed, commonly by exposing the IC (100) to an oxygen containing plasma, followed by a wet cleanup to remove any organic residue from the top surface of the IC (100).

In an alternate embodiment, an n-type set of quantum well dopants may be implanted into the p-well (103) in the GRTD region (105) preferably at a depth between 1 and 10 nanometers to form a shallow n-type region extending to the top surface of the p-well (103). Formation of an n-type region at the p-well surface of the GRTD region (105) is advantageous because a quantum well may be formed requiring less bias on a gate node.

Figure 1B:
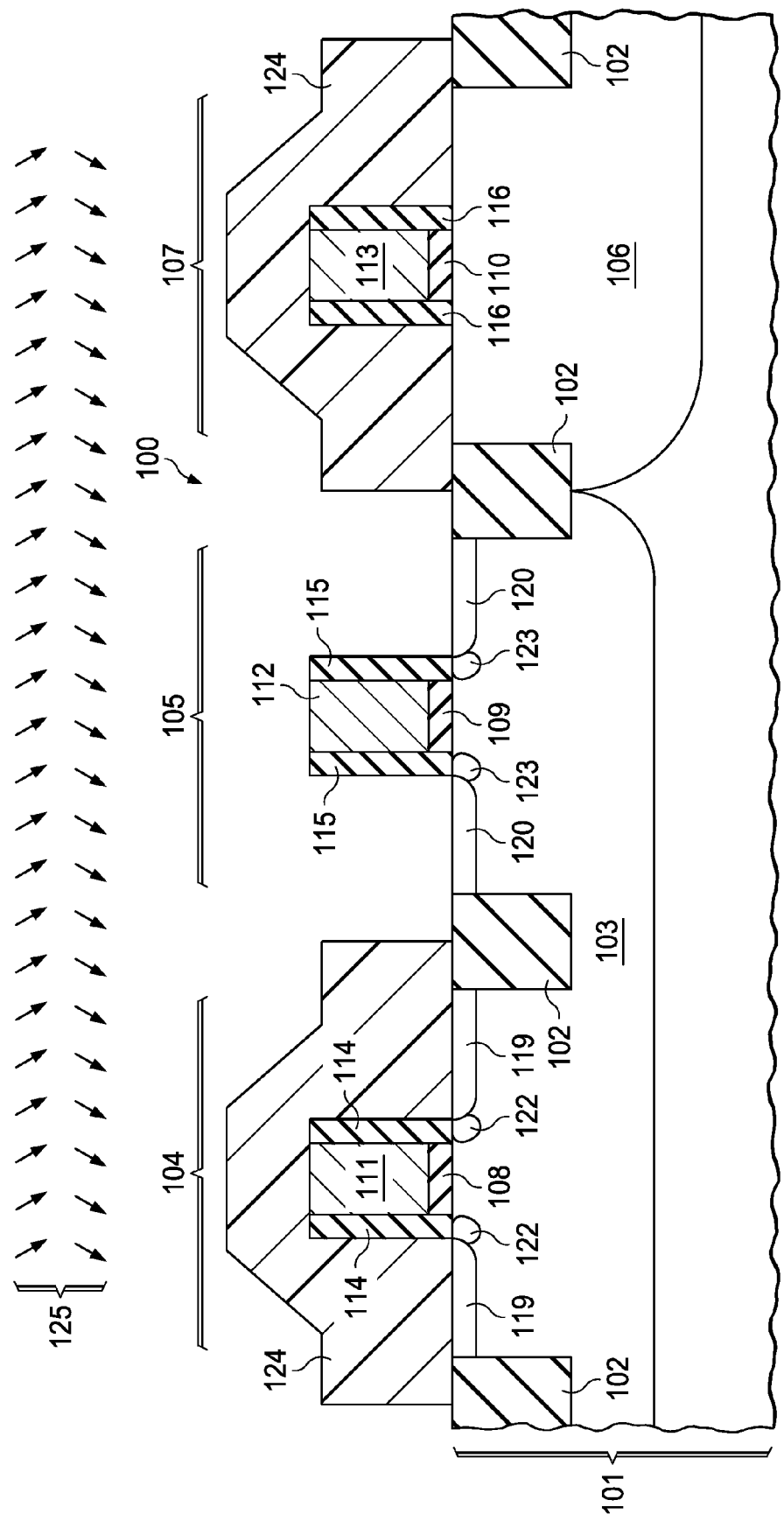

FIG. 1B depicts the IC (100) during a GRTD halo implant process. A GRTD halo photoresist pattern (124) is formed on the top surfaces of the p-well (103) and NMOS gate (111), and on the n-well (106) and PMOS gate (113), using known photolithographic methods. A GRTD halo set of p-type dopants (125), typically boron, a portion of which may be in the form $BF_2$, is ion implanted into the top layer of the p-well (103), preferably at a total dose between $1 \cdot 10^{14}$ and $3 \cdot 10^{15}$ atoms/cm$^2$, to increase a dopant density in the GRTD halo implanted regions (123) above $10^{20}$ cm$^{-3}$. Similarly to the ion implantation of the NMOS halo set of p-type dopants, the GRTD halo set of p-type dopants (125) is preferably ion implanted in two or four subdoses, wherein each subdose is ion implanted at an angle of 10 to 30 degrees from a vertical axis of the IC (100), and rotated about the vertical axis to provide a uniform concentration of p-type dopants in the GRTD halo implanted regions (123) on all sides of the GRTD gate (112). The GRTD halo photoresist pattern (124) is removed, using known methods, for example by exposing the IC (100) to an oxygen containing plasma, followed by a wet cleanup to remove any organic residue from the top surface of the IC (100).

In an alternate embodiment, n-type dopants may also be ion implanted at this step to augment a doping density in the GRTD LDD implanted regions (120).

In yet another embodiment, the NLDD photoresist pattern (117) depicted in FIG. 1A may cover the GRTD region (105), and the GRTD LDD implanted regions (120) and GRTD halo implanted regions (123) may be formed while the GRTD halo photoresist pattern (124) is in place.

Figure 1C:
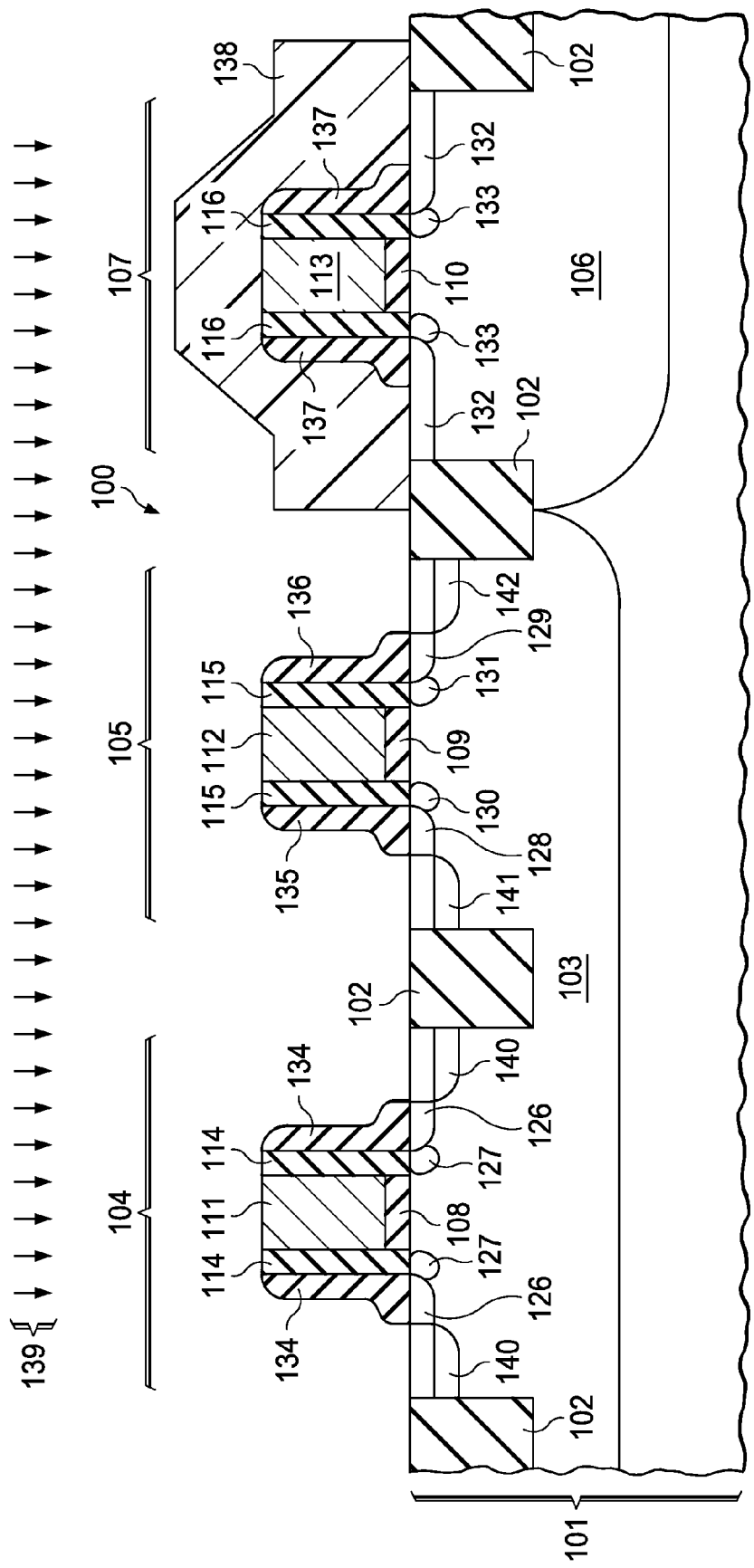

FIG. 1C depicts the IC (100) at a subsequent stage of fabrication. It is common to perform an NLDD anneal operation on the IC (100), using known methods of rapid thermal processing (RTP) or laser annealing, to activate a portion of the NLDD set of n-type dopants, NMOS halo set of p-type dopants and GRTD halo set of p-type dopants to form NLDD annealed regions (126) and NMOS halo annealed regions (127) in the NMOS transistor region (104), and a source GRTD LDD annealed region (128), a drain GRTD LDD annealed region (129), a source GRTD halo annealed region (130) and a drain GRTD halo annealed region (131).

Still referring to FIG. 1C, p-type lightly doped drain (PLDD) annealed regions (132) and PMOS halo annealed regions (133) are formed in the PMOS region (107). The PLDD annealed regions (132) are formed by defining PLDD regions using known photolithographic methods, ion implanting a PLDD set of p-type dopants, typically boron, a portion of which is commonly in the form $BF_2$, and possibly including gallium or indium, into a top layer of the n-well (106) adjacent to the PMOS offset spacers (116), at a total dose typically between $1 \cdot 10^{13}$ and $5 \cdot 10^{14}$ atoms/cm$^2$, to a depth in the n-well (106) between 10 and 50 nanometers, to form PLDD implanted regions. The PMOS halo annealed regions (133) are formed by ion implanting a PMOS halo set of n-type dopants, typically phosphorus, and commonly including arsenic, into the top layer of the n-well (106), typically at a total dose between $1 \cdot 10^{12}$ and $3 \cdot 10^{13}$ atoms/cm$^2$, adjacent to the PLDD implanted regions to form PMOS halo implanted regions. A PLDD anneal operation, using known RTP or laser annealing methods, is performed on the IC (100) which activates a portion of the PLDD set of p-type dopants and PMOS halo set of n-type dopants in the PLDD implanted regions and PMOS halo implanted regions to form PLDD annealed regions (132) and PMOS halo annealed regions (133), respectively.

Continuing to refer to FIG. 1C, NMOS gate sidewall spacers (134), typically silicon nitride or layers of silicon nitride and silicon dioxide, between 30 and 80 nanometers thick are formed on lateral surfaces of the NMOS offset spacers (114), commonly by known methods of conformal deposition of a layer of silicon nitride or layers of silicon nitride and silicon dioxide, followed by an anisotropic etch which removes the conformally deposited material from top surfaces of the NMOS gate (111) and NLDD annealed regions (126) to leave the NMOS gate sidewall spacers (134) on the lateral surfaces of the NMOS offset spacers (114) and the top surface of the p-well (103) immediately adjacent to the NMOS offset spacers (114). Similarly, a source GRTD gate sidewall spacer (135), a drain GRTD gate sidewall spacer (136) and PMOS gate sidewall spacers (137), of similar materials and dimensions to the NMOS gate sidewall spacers (134), are formed on lateral surfaces of the GRTD offset spacers (115) and on lateral surfaces of the PMOS offset spacers (116), respectively. An n-type source/drain (NSD) photoresist pattern (138) is formed on top surfaces of the PLDD annealed regions (132) and PMOS gate (113). An NSD set of n-type dopants (139), typically phosphorus, and commonly including arsenic, is ion implanted into the top region of the p-well (103) adjacent to the NMOS gate sidewall spacers (134), the source GRTD gate sidewall spacer (135) and the drain GRTD gate sidewall spacer (136), at a total dose typically between $1 \cdot 10^{14}$ and $5 \cdot 10^{16}$ atoms/cm$^2$, to a depth in the p-well (103) between 25 and 250 nanometers, to form NMOS NSD implanted regions (140), a source GRTD implanted region (141) and a drain GRTD implanted region (142). The NSD photoresist pattern (138) blocks the NSD set of n-type dopants (139) from areas where the NSD set of n-type dopants is not desired, for example, areas defined for PMOS transistors. The NSD photoresist pattern (138) is removed, commonly by exposing the IC (100) to an oxygen containing plasma, followed by a wet cleanup to remove any organic residue from the top surface of the IC (100).

Figure 1D:
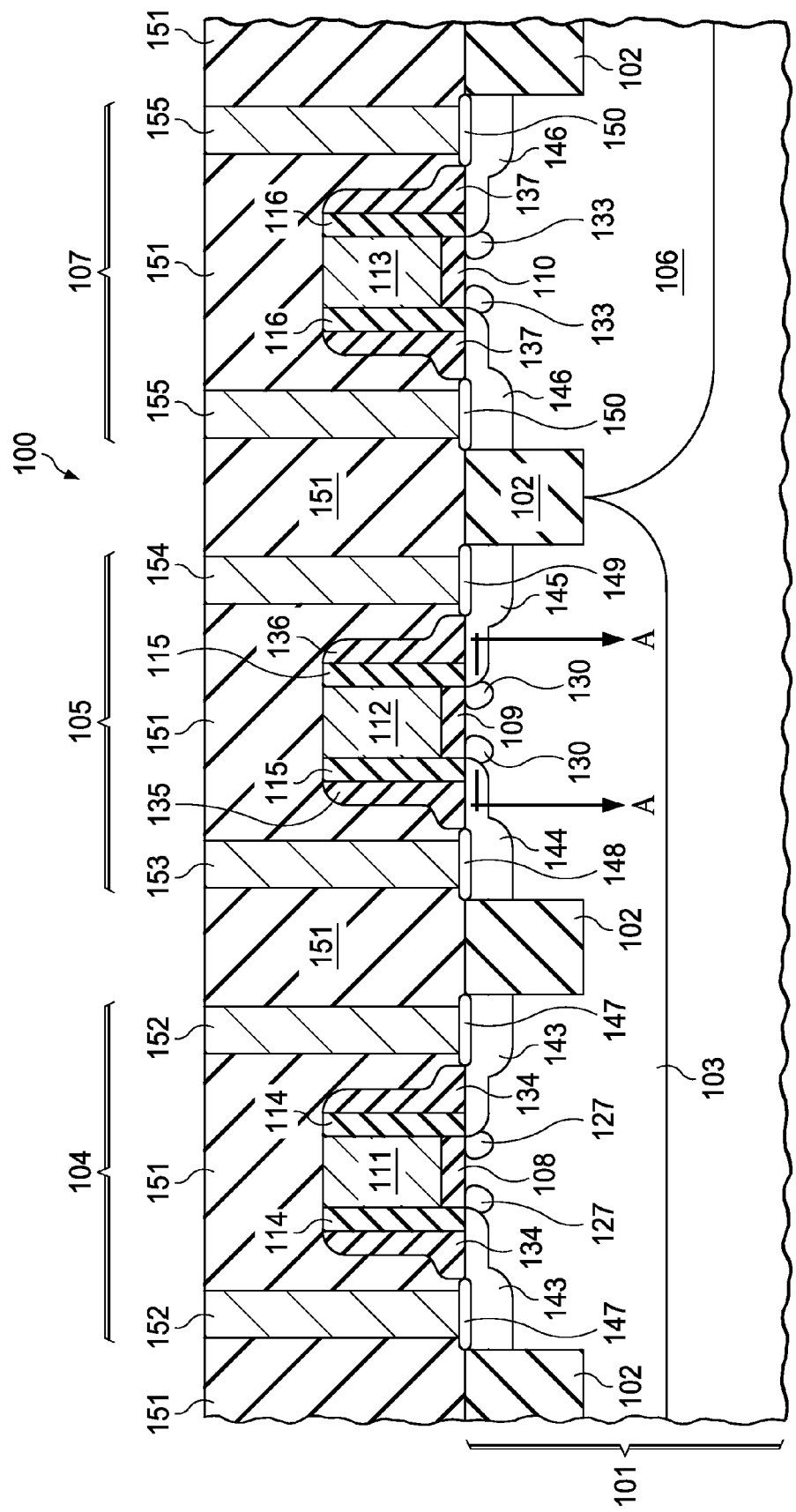

FIG. 1D depicts the IC (100) after fabrication of the NMOS transistor, GRTD and PMOS transistor is substantially completed, and contacts have been formed on the source and drain nodes of the NMOS transistor, GRTD and PMOS transistor. P-type source/drain (PSD) implanted regions are formed in the PMOS region (107) by ion implanting a PSD set of p-type dopants, typically boron, and possibly gallium or indium, into the top region of the n-well (106) adjacent to the PMOS gate sidewall spacers (137) at a total dose typically between $1 \cdot 10^{14}$ and $5 \cdot 10^{16}$ atoms/cm$^2$, to a depth in the n-well (106) between 25 and 250 nanometers. A source/drain anneal operation is performed on the IC (100) using known RTP or laser annealing methods which activates a portion of the NSD set of n-type dopants so as to transform the NLDD annealed regions (126) and NSD implanted regions (140) depicted in FIG. 1C into NSD regions (143) in the NMOS transistor region (104), transform the source GRTD LDD annealed region (128) and n-type GRTD source implanted region (141) depicted in FIG. 1C into an n-type GRTD source region (144), and transform the drain GRTD LDD annealed region (129) and the GRTD drain implanted region (142) depicted in FIG. 1C into an n-type GRTD drain region (145). The source/drain anneal operation also activates a portion of the PSD set of p-type dopants so as to transform the PLDD annealed regions (132) depicted in FIG. 1C and the PSD implanted regions into PSD regions (146) in the PMOS transistor region (107).

Still referring to FIG. 1D, it is common to replace the polysilicon in the NMOS gate (111), GRTD gate (112) and PMOS gate (113) with a metal or a metal silicide, by an appropriate known method. For example, the polysilicon may be replaced with nickel silicide by depositing a layer of nickel on the top surfaces of the NMOS gate (111), GRTD gate (112) and PMOS gate (113) and heating the IC (100) to react the polysilicon with the nickel to form nickel silicide, followed by selective removal of unreacted nickel, commonly by a wet etch process. Metal silicide layers are formed on the NSD regions (143), GRTD source region (144), GRTD drain region (145), and PSD regions (146) by known methods, including depositing of a metal layer on a top surface of the IC (100), heating the IC (100) to react the metal with exposed silicon to form metal silicide, and selective removal of unreacted metal, to leave NSD silicide layers (147), a GRTD source silicide layer (148), a GRTD drain silicide layer (149) and PSD silicide layers (150).

Continuing to refer to FIG. 1D, a pre-metal dielectric (PMD) layer (161), typically a dielectric layer stack including a silicon nitride or silicon dioxide PMD liner 10 to 100 nanometers thick deposited by plasma enhanced chemical vapor deposition (PECVD), a layer of silicon dioxide, phospho-silicate glass (PSG) or boro-phospho-silicate glass (BPSG), commonly 100 to 1000 nanometers thick deposited by PECVD, commonly leveled by a chemical-mechanical polish (CMP) process, and an optional PMD cap layer, commonly 10 to 100 nanometers of a hard material such as silicon nitride, silicon carbide nitride or silicon carbide, is formed on a top surface of the IC (100). NMOS source and drain contacts (162), a GRTD source contact (163), a GRTD drain contact (164) and PMOS source and drain contacts (165), which make electrical connections to the NSD silicide layers (147), GRTD source silicide layer (148), a GRTD drain silicide layer (149) and PSD silicide layers (150), respectively, are formed in the PMD layer (161) by known methods, including forming a contact photoresist pattern, not shown in FIG. 1D for clarity, on a top surface of the PMD layer (161) which exposes areas for contacts, etching contact holes through the PMD layer (161) to expose silicide layers on the IC (100) and filling the contact holes with a contact liner metal and a contact fill metal, typically tungsten. Contacts are also formed to make electrical connections to the NMOS gate (111), GRTD gate (112) and PMOS gate (113), but are not shown in FIG. 1D for clarity.

Figure 2A:
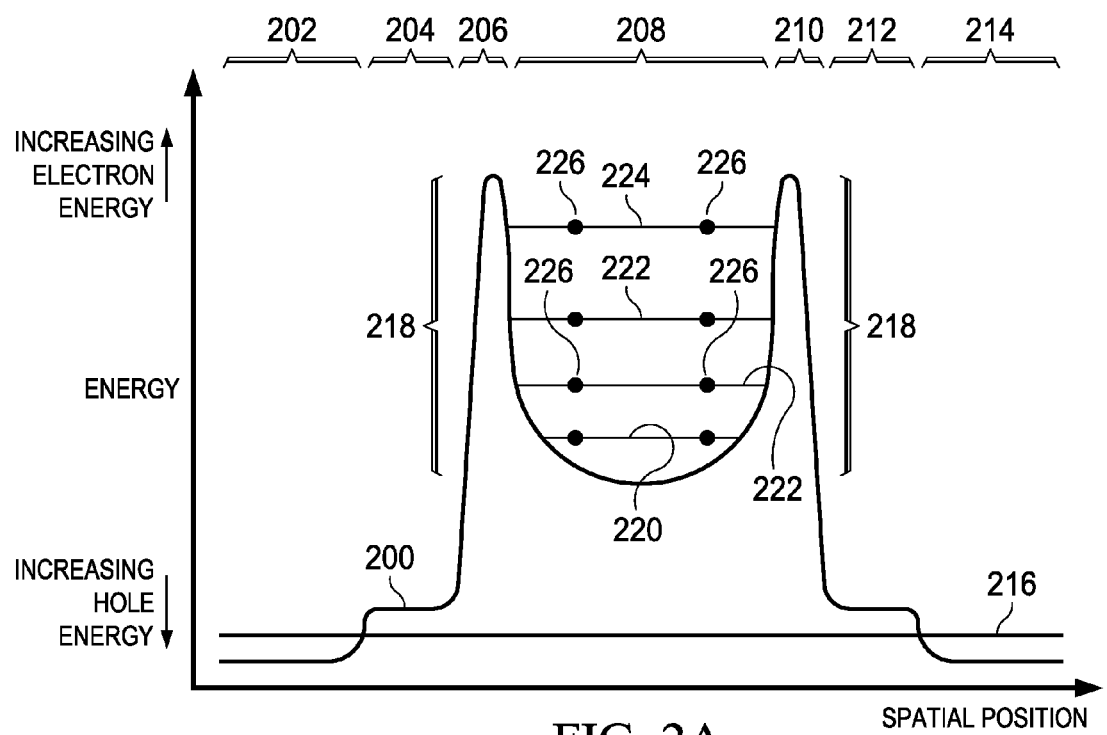
FIGS. 2A through 2C are energy band diagrams.
Figure 2B:
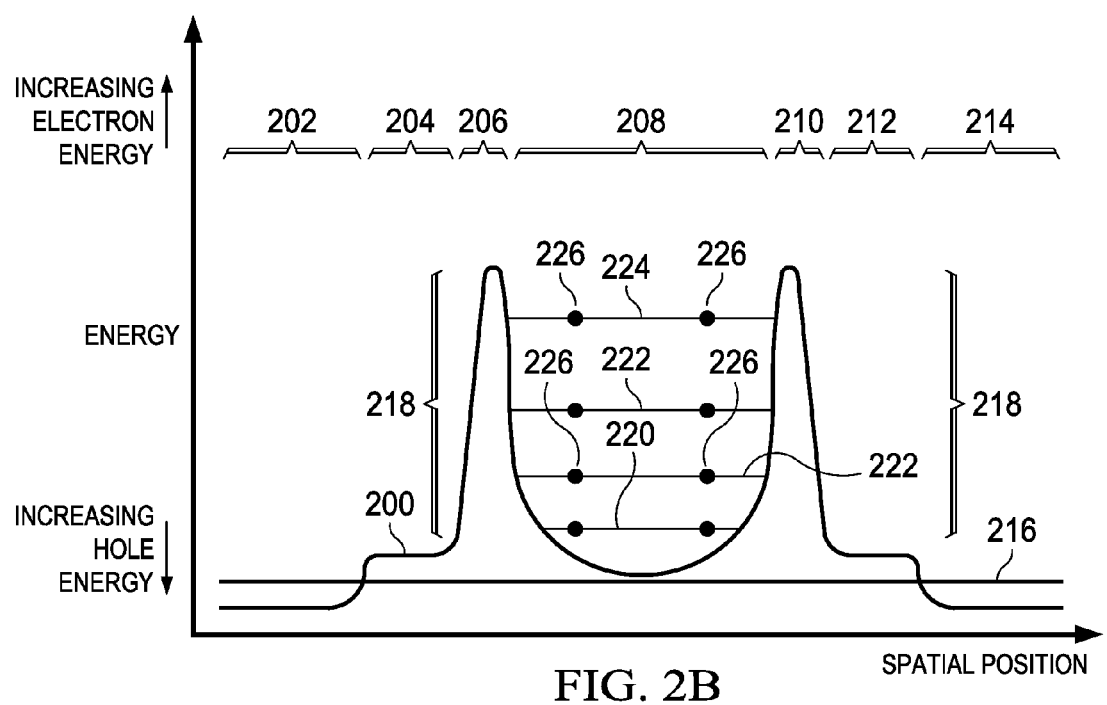
Figure 2C:
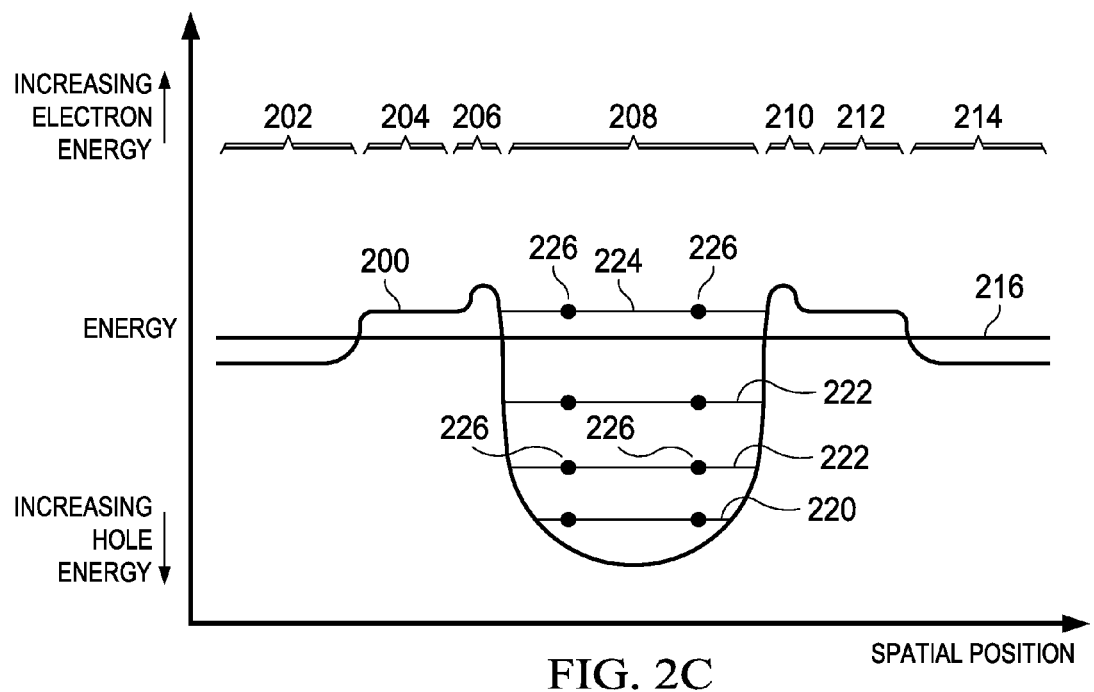

FIG. 2A through 2C are energy band diagrams of GRTD elements as recited in the first embodiment discussed in reference to FIG. 1A through FIG. 1D, for example along section line A-A in FIG. 1D. Referring to FIG. 2A, a GRTD gate is biased with respect to a p-well containing the GRTD to form an n-type quantum well in a region below the GRTD gate dielectric layer. A conduction band edge (200) is plotted through an n-type GRTD source region (202), an n-type GRTD source side LDD region (204), a p-type GRTD source halo region (206), a quantum well region (208), a p-type GRTD drain halo region (210), an n-type GRTD drain side LDD region (212) and an n-type GRTD drain region (214). The GRTD source region (202) and the GRTD drain region (214) are biased at zero volts with respect to the p-well containing the GRTD. The GRTD source region (202) and GRTD drain region (214) are degenerately doped, causing the conduction band edge (200) to be lower in energy than a Fermi level (216). A p-type dopant density above $10^{20}$ cm$^{-3}$ in the GRTD source halo region (206) and GRTD drain halo region (210) causes the conduction band edge (200) to form electron energy barriers (218) on each side of the quantum well region (208). An energy depth of the quantum well region (208) is a function of the GRTD gate bias with respect to the GRTD source region, and in a preferred embodiment, is more than 400 meV. The quantum well supports discrete electron energy levels, including a lowest energy level (220), intermediate energy levels (222) and a maximum energy level (224). In embodiments of the GRTD with lateral dimensions of the quantum well region (208) preferably less than 15 nanometers but possibly as much as 20 nanometers, separation between energy levels (220, 222, 224) may be more than 50 meV. This is advantageous because energy levels separated by more than 50 meV may be individually accessed at room temperature. Each energy level (220, 222, 224) holds a precise number of electrons (226).

FIG. 2B depicts the GRTD elements described in reference to FIG. 2A, in a bias condition in which the gate is biased more positively than in the bias configuration depicted in FIG. 2A, moving the n-type quantum well closer to the Fermi level (216).

FIG. 2C depicts the GRTD elements described in reference to FIG. 2A, in a bias condition in which the gate is biased more positively than in the bias configuration depicted in FIG. 2B, so that electron energy levels are moved below the Fermi level (216) or within a few tens of milli-electron volts of the Fermi level (216). In this bias configuration, all energy levels remain populated.

Figure 3:
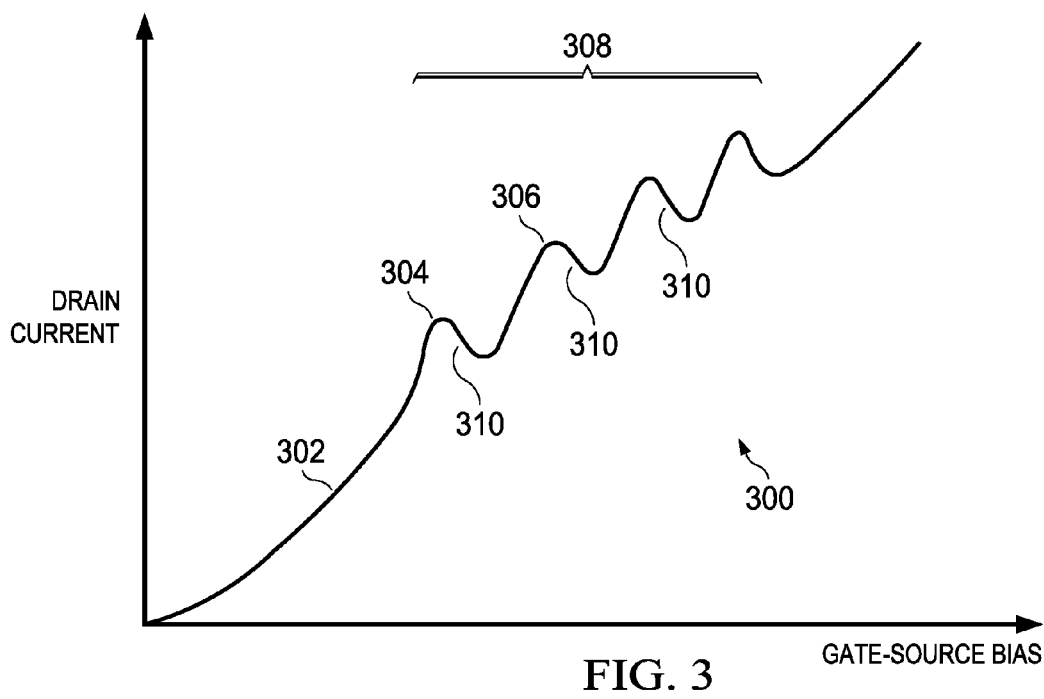
FIG. 3 is a current-voltage diagram of a GRTD.

FIG. 3 is a current-voltage diagram of a GRTD in which a gate node of the GRTD is biased as described in reference to FIG. 2B, and a drain node of the GRTD is biased between 1 and 5 millivolts positive with respect to a source node of the GRTD. The current-voltage diagram (300) shows drain current (302) rising as the gate bias is increased. As the gate bias is increased further, a lowest electron energy level in a quantum well of the GRTD becomes aligned with a highest populated electron energy level in the drain, causing the drain current (302) to increase at a faster rate and then decrease as the lowest electron energy level is moved below a conduction band edge in the drain by yet further increase in the gate bias, depicted in FIG. 3 by a first hump (304) in the drain current (302). As the gate bias is increased further, a second electron energy level in the quantum well passes through an alignment with the highest populated electron energy level in the drain, causing a second hump (306) in the drain current (302). A total number of humps (308) in the drain current (302) is equal to a total number of discrete energy levels in a quantum dot GRTD or energy bands in a quantum wire GRTD. At each hump exists a negative conductance region (310) which is characterized by a decrease in drain current (302) as the gate bias is increased. Negative conductance is advantageous in a variety of circuits, including oscillators and amplifiers.

Figure 4:
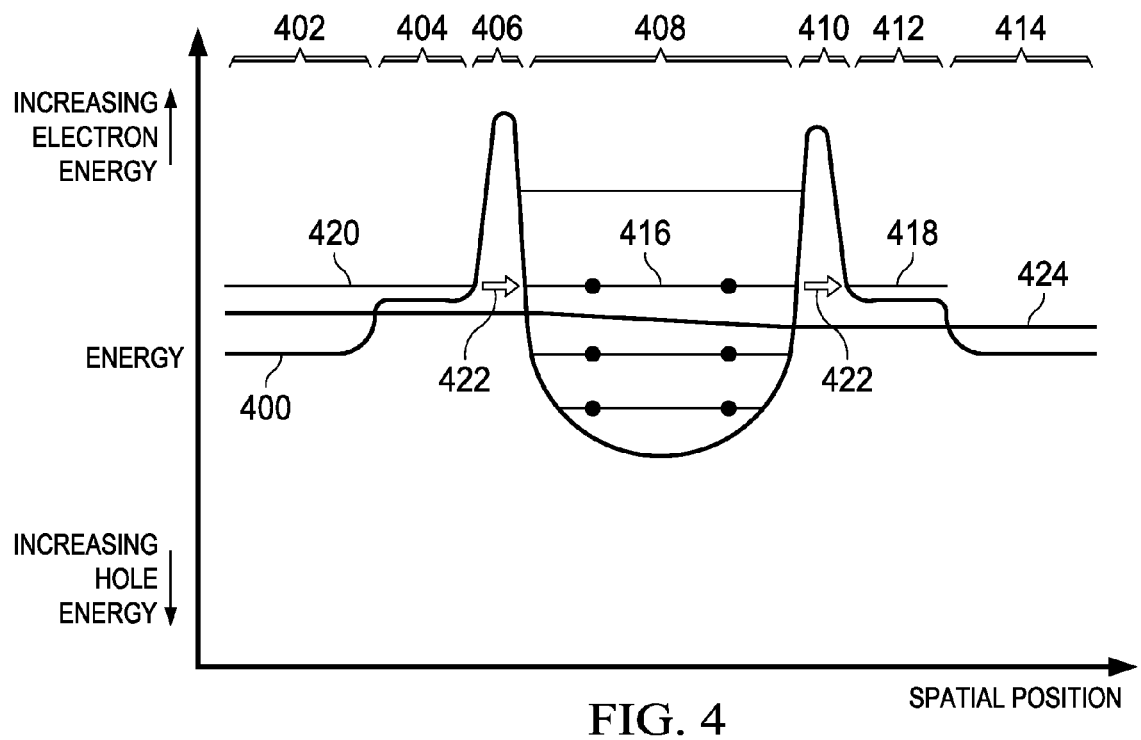
FIG. 4 is a band diagram of GRTD elements as recited in the first embodiment discussed in reference to FIG. 1A through FIG. 1D, depicting operation of the GRTD in a negative conductance mode.

FIG. 4 is a band diagram of GRTD elements as recited in the first embodiment discussed in reference to FIG. 1A through FIG. 1D, depicting operation of the GRTD in a negative conductance mode. A conduction band edge (400) is plotted through an n-type GRTD source region (402), an n-type GRTD source side LDD region (404), a p-type GRTD source halo region (406), a quantum well region (408), formed by appropriately biasing a GRTD gate with respect the GRTD source region (402), a p-type GRTD drain halo region (410), an n-type GRTD drain side LDD region (412) and an n-type GRTD drain region (414). The GRTD drain region (414) is positively biased between 1 and 10 millivolts with respect to the GRTD source region (402). A gate node of the GRTD is biased positively with respect to the GRTD source region (402) so that an electron energy level (416) in the quantum well region (408) is lowered to be substantially aligned to an unpopulated energy level (418) in the GRTD drain side LDD region (412) and a populated source side electron energy level (420) in the GRTD source side LDD region (404). Resonant tunneling of electrons in the populated source side electron energy level (420) through the quantum well electron energy level (416) to the empty drain side electron energy level (418) occurs, as depicted by the electron tunneling arrows (422). A Fermi level (424) depicts the effect of the drain bias by a slope in the quantum well region (408). Increasing the bias on the drain node results in a decrease in tunneling current, while decreasing the drain node bias results in an increase in tunneling current, which is a phenomenon commonly known as negative resistance. Negative resistance operation is advantageous in a variety of circuits, including oscillators and amplifiers.

Figure 5A:
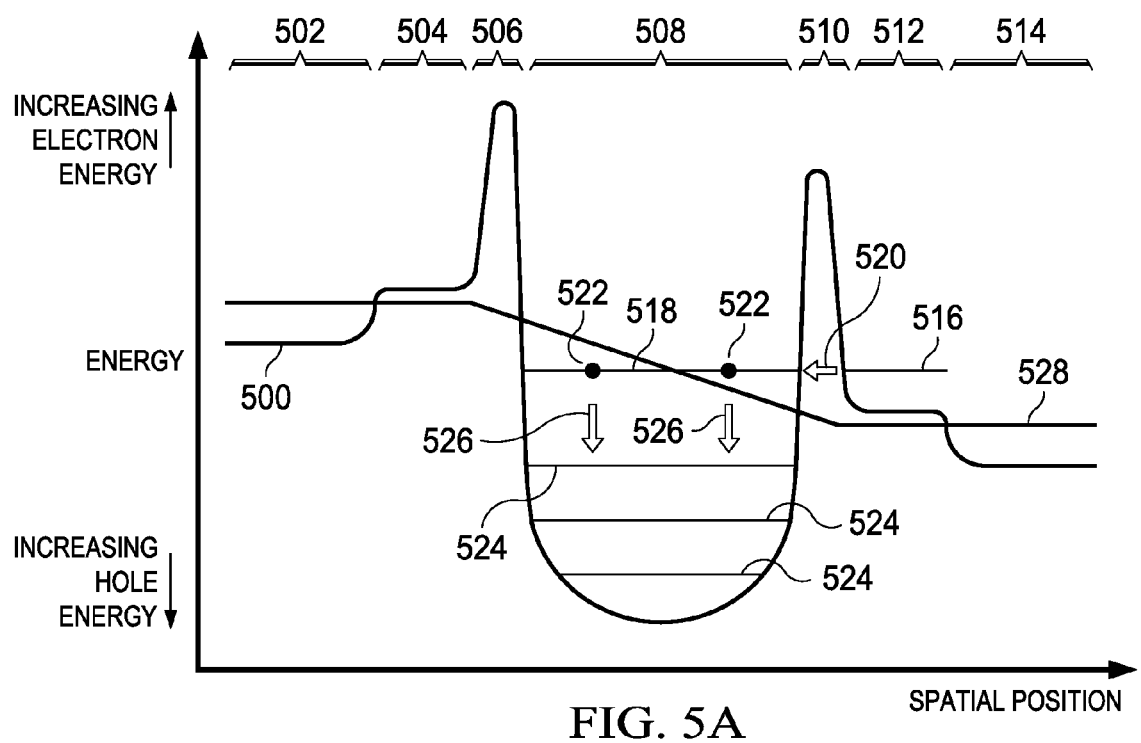
FIG. 5A and FIG. 5B are band diagrams of GRTD elements as recited in the first embodiment discussed in reference to FIG. 1A through FIG. 1D, depicting operation of the GRTD in a charge pump mode.
Figure 5B:
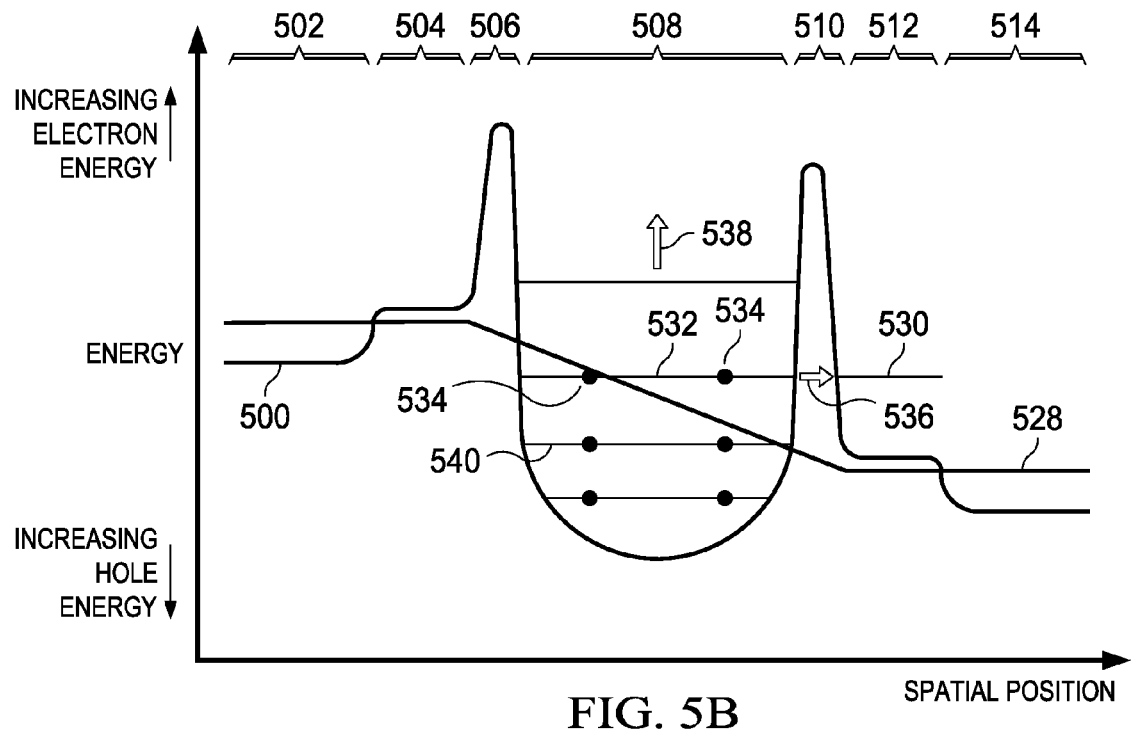

FIG. 5A and FIG. 5B are band diagrams of GRTD elements as recited in the first embodiment discussed in reference to FIG. 1A through FIG. 1D, depicting operation of the GRTD in a charge pump mode. FIG. 5A depicts a quantum well filling operation. A conduction band edge (500) is plotted through an n-type GRTD source region (502), an n-type GRTD source side LDD region (504), a p-type GRTD source halo region (506), a quantum well region (508), formed by appropriately biasing a GRTD gate with respect to the GRTD source region (502) such that electron energy levels in the quantum well region (508) are below the conduction band edge (500) in the GRTD source side LDD region (504), a p-type GRTD drain halo region (510), an n-type GRTD drain side LDD region (512) and an n-type GRTD drain region (514). The GRTD drain region (514) is positively biased with respect to the GRTD source region (502) to align a populated electron energy level (516) in the GRTD drain side LDD region (512) with a top electron energy level (518) in the quantum well region (508). Electrons in the populated electron energy level (516) tunnel through the p-type GRTD drain halo region (510) to the top energy level (518) in the quantum well region (508), as depicted by the electron tunneling arrow (520). Electrons (522) in the top energy level (516) in the quantum well region (508) transition to lower energy levels (524) in the quantum well region (508), as depicted by the electron transition arrows (526). A Fermi level (528) depicts the effect of the drain bias by a slope in the quantum well region (508).

FIG. 5B depicts a quantum well emptying operation. The bias on the GRTD drain region (514) is increased so that an unpopulated electron energy level (530) in the GRTD drain side LDD region (512) is raised to be substantially equal to the top filled energy level (532) in the quantum well region (508). Electrons (534) in the top filled energy level (532) tunnel through the p-type GRTD drain halo region (510) to the unpopulated electron energy level (530), as depicted by the electron tunneling arrow (536). After the top filled energy level (532) is emptied, the bias on the GRTD gate is adjusted to reduce an energy depth of the quantum well region (508), which results in the energy levels in the quantum well region (508) rising with respect to the unpopulated electron energy level (530), as depicted by energy level transition arrow (538), until a next populated energy level (540) in the quantum well region (508) is substantially equal to the unpopulated electron energy level (530). The steps of emptying an energy level by tunneling through the p-type GRTD drain halo region (510) to the unpopulated electron energy level (530), and raising the energy levels in the quantum well region (508) to align a next populated energy level with the unpopulated electron energy level (530) are repeated until a desired quantity of charge is removed from the quantum well region (508).

Figure 6:
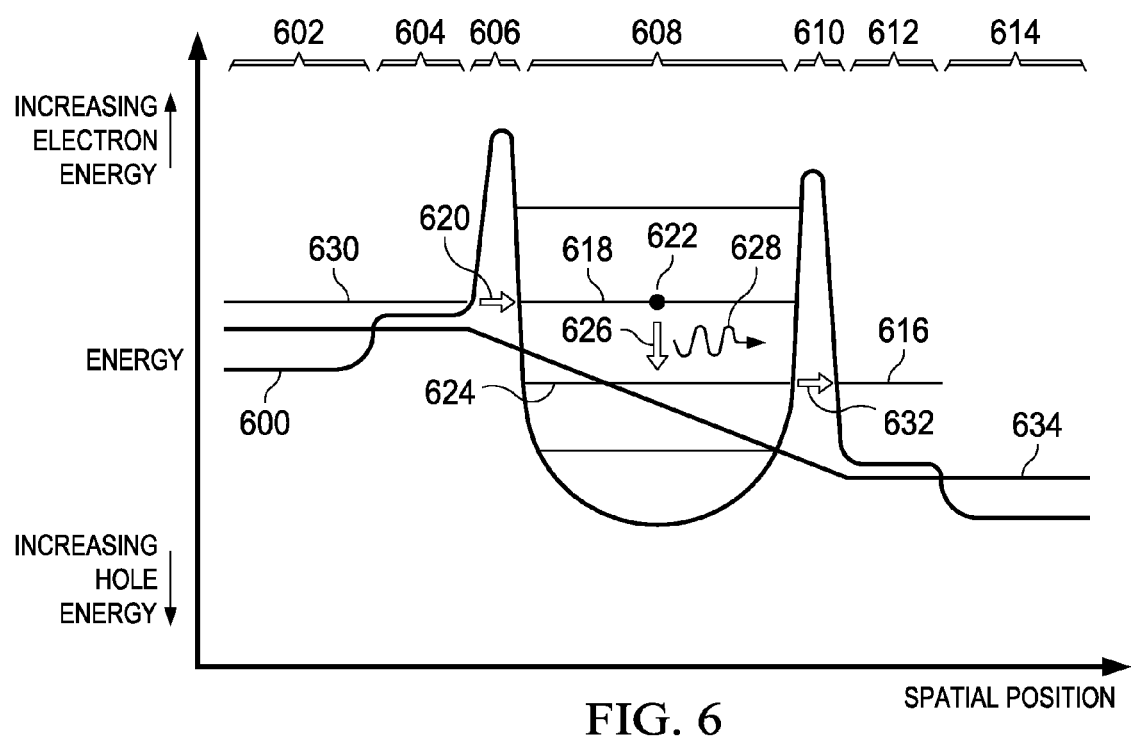
FIG. 6 is a band diagram of GRTD elements as recited in the first embodiment discussed in reference to FIG. 1A through FIG. 1D, depicting operation of the GRTD in a radiative emission mode.

FIG. 6 is a band diagram of GRTD elements as recited in the first embodiment discussed in reference to FIG. 1A through FIG. 1D, depicting operation of the GRTD in a radiative emission mode. A conduction band edge (600) is plotted through an n-type GRTD source region (602), an n-type GRTD source side LDD region (604), a p-type GRTD source halo region (606), a quantum well region (608) formed by appropriately biasing a GRTD gate with respect to the GRTD source region (602) such that a first electron energy level (618) in the quantum well region (608) is substantially aligned with a populated electron energy level (630) in the GRTD source side LDD region (604), a p-type GRTD drain halo region (610), an n-type GRTD drain side LDD region (612) and an n-type GRTD drain region (614). The GRTD drain region (614) is positively biased with respect to the GRTD source region (602) so that an unpopulated electron energy level (616) in the GRTD drain side LDD region (612) is substantially aligned to an intermediate energy level (624) in the quantum well region (608) which is energetically below the first electron energy level (618). Tunneling of an electron in the GRTD source side LDD region (604) to the first energy level (618) occurs, as depicted by a first electron tunneling arrow (620). The electron (622) in the first energy level (618) drops to a intermediate energy level (624) which is lower in energy than the first energy level (618), as depicted by an electron transition arrow (626) and desirably emits a photon (628) which has an energy equal to a difference in energy between the first energy level (618) and the intermediate energy level (624). The electron (622) subsequently tunnels from the intermediate energy level (624) to an empty drain side energy level (616) in the GRTD drain side LDD region (612), as depicted by a second electron tunneling arrow (632). Radiative emission is advantageous in a variety of circuits including sensors and communication circuits. A Fermi level (634) depicts the effect of the drain bias by a slope in the quantum well region (608).

Figure 7A:
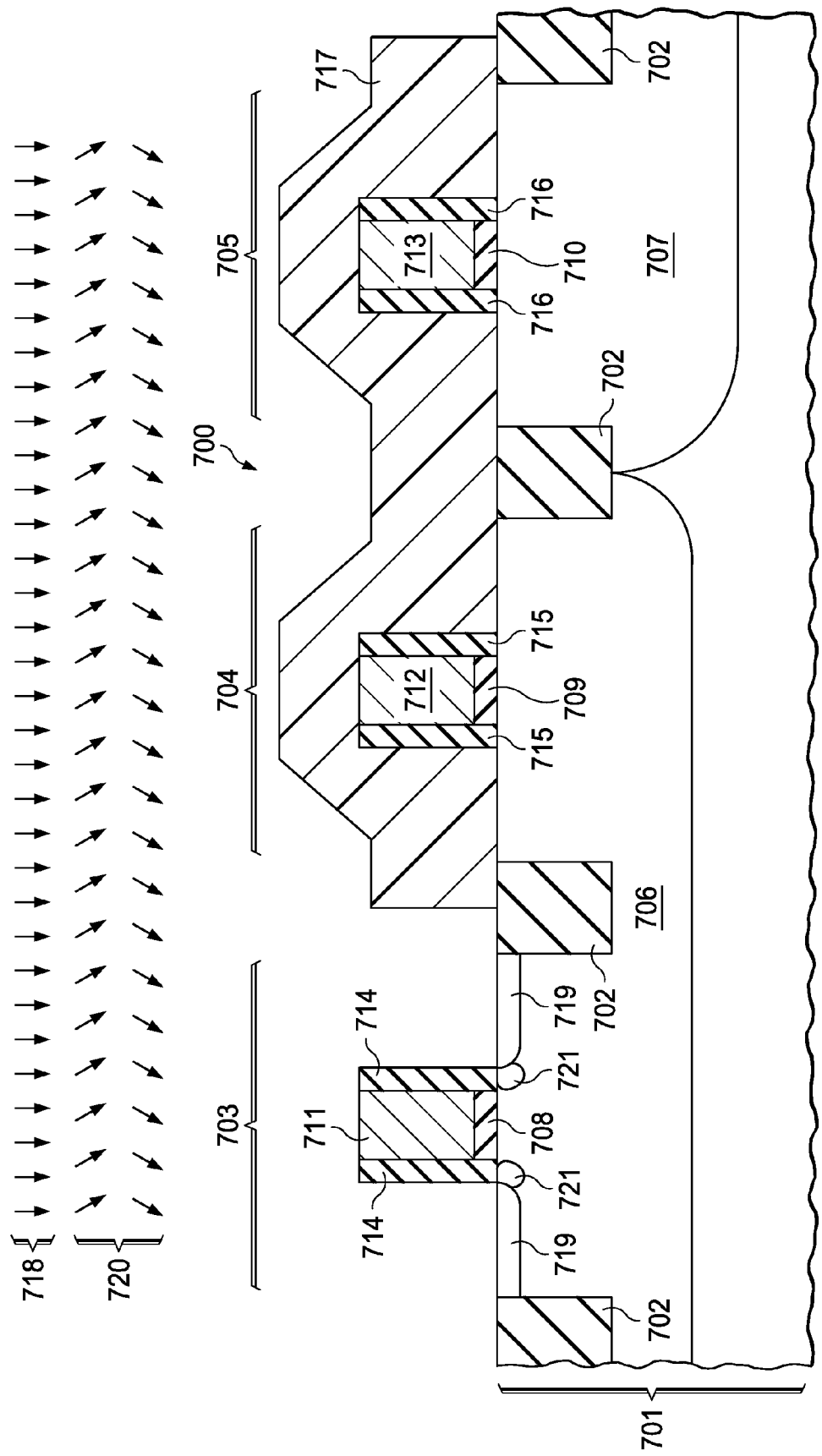
FIG. 7A through FIG. 7D are cross-sections of a CMOS IC including a GRTD formed according to a second embodiment of the instant invention, depicted in successive stages of fabrication.
Figure 7B:
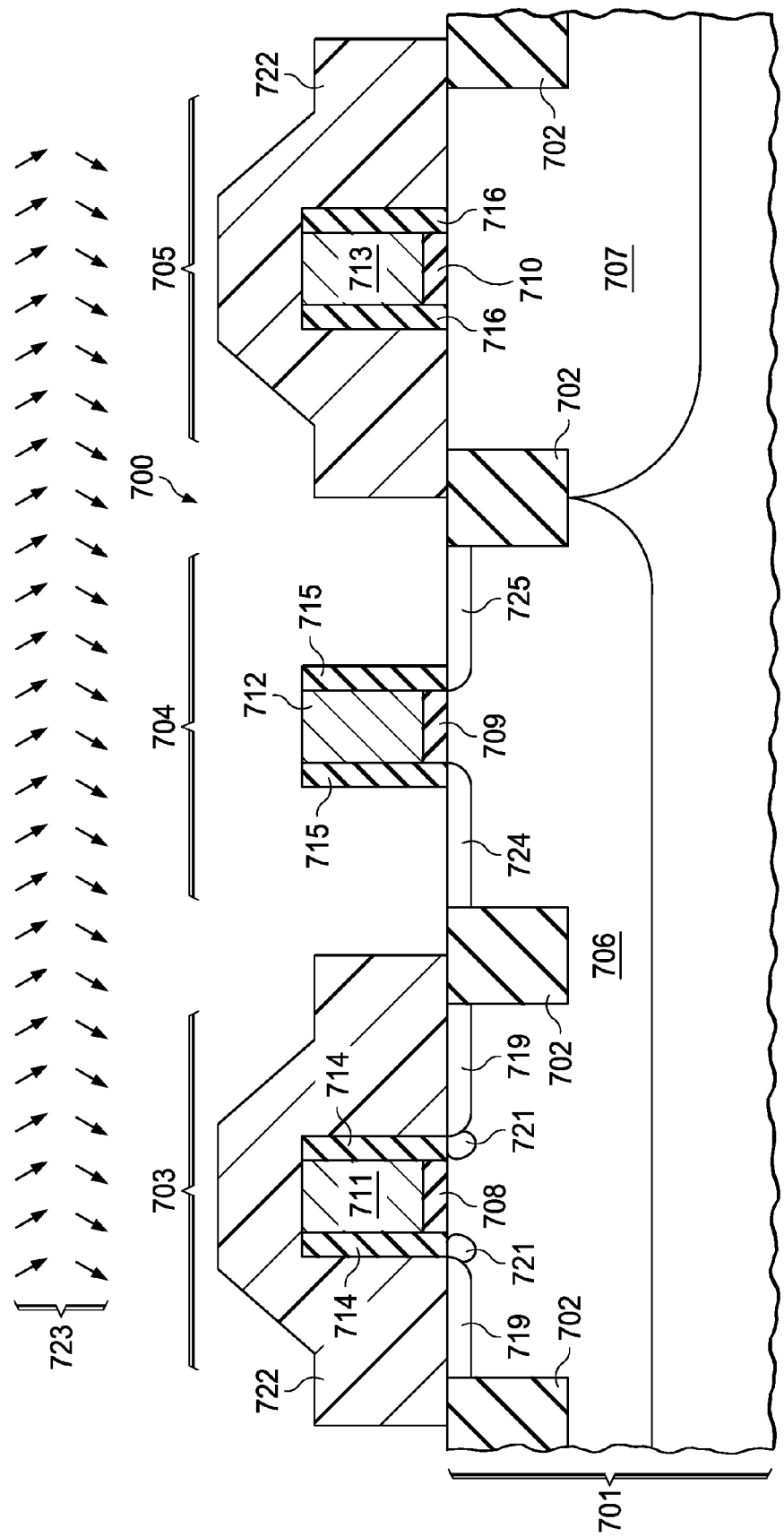
Figure 7C:
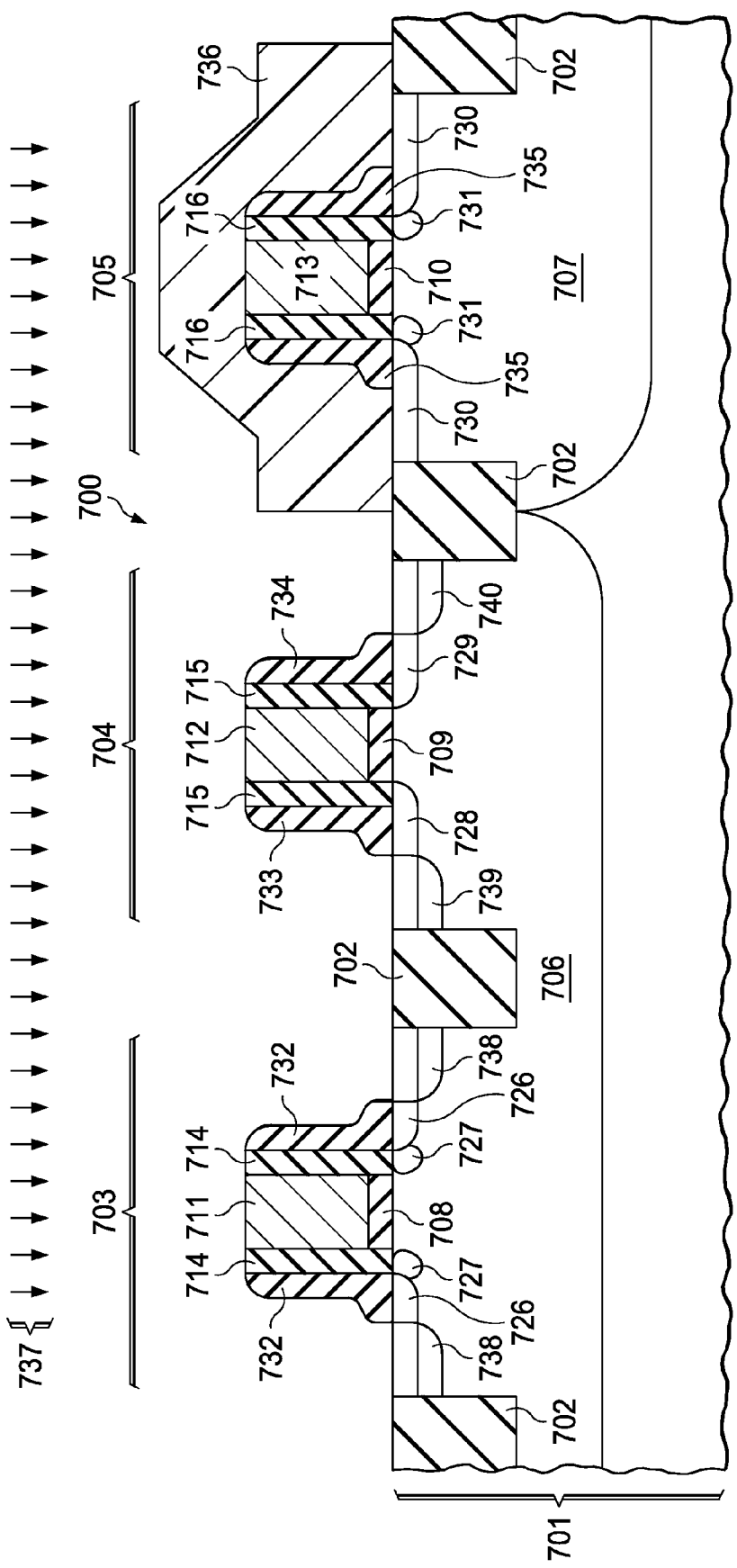

FIG. 7A through FIG. 7C are cross-sections of a CMOS IC including a GRTD formed according to a second embodiment of the instant invention, depicted in successive stages of fabrication. Referring to FIG. 7A, the IC (700) is formed in a semiconductor substrate (701) with the properties described in reference to FIG. 1A. Elements of field oxide (702) are formed in the substrate (701) by an STI process, separating an NMOS region (703), a GRTD region (704) and a PMOS region (705). A p-well (706) is formed in the substrate (701) in the NMOS region (703) and the GRTD region (704) as described in reference to FIG. 1A. Similarly, an n-well (707) is formed in the substrate (701) in the PMOS region (705) as described in reference to FIG. 1A. An NMOS gate dielectric layer (708), a GRTD gate dielectric layer (709) and a PMOS gate dielectric layer (710) are formed on top surfaces of the substrate (701), with the properties described in reference to FIG. 1A, in the NMOS region (703), the GRTD region (704) and the PMOS region (705), respectively. An NMOS gate (711), a GRTD gate (712) and a PMOS gate (713) are formed on top surfaces of the NMOS gate dielectric layer (708), the GRTD gate dielectric layer (709) and the PMOS gate dielectric layer (710), respectively, as described in reference to FIG. 1A. NMOS offset spacers (714), GRTD offset spacers (715) and PMOS offset spacers (716) are formed on lateral surfaces of the NMOS gate (711), the GRTD gate (712) and the PMOS gate (713), as described in reference to FIG. 1A.

Continuing to refer to FIG. 7A, an NLDD photoresist pattern (717) is formed on top surfaces of the n-well (707), PMOS gate (713), p-well (706) in the GRTD region (704) and the GRTD gate (712), using known photolithographic methods. An NLDD set of n-type dopants (718), typically phosphorus and arsenic, and possibly antimony, is ion implanted into a top layer of the p-well (706) adjacent to the NMOS offset spacers (714) at a total dose typically between $1 \cdot 10^{13}$ and $5 \cdot 10^{14}$ atoms/cm$^2$, to a depth in the p-well (706) between 10 and 50 nanometers, to form NLDD implanted regions (719) in the NMOS transistor region (703). The NLDD photoresist pattern (717) blocks the NLDD set of n-type dopants (718) from areas where the NLDD set of n-type dopants is not desired, for example, the GRTD region (704) and PMOS region (705). While the NLDD photoresist pattern (717) is in place, an NMOS halo set of p-type dopants (720), typically boron, a portion of which is commonly in the form BF$_2$, and possibly gallium or indium, is ion implanted into the top layer of the p-well (706), typically at a total dose between $1 \cdot 10^{12}$ and $3 \cdot 10^{13}$ atoms/cm$^2$, to form p-type NMOS halo implanted regions (721) laterally abutting the NLDD implanted regions (719). The NMOS halo set of p-type dopants (720) is typically ion implanted in two or four subdoses, wherein each subdose is ion implanted at an angle of 10 to 30 degrees from a vertical axis of the IC (700), and rotated about the vertical axis to provide a uniform concentration of p-type dopants in the NMOS halo implanted regions (721) on all sides of the NMOS gate (711). The NLDD photoresist pattern (717) is removed, commonly by exposing the IC (700) to an oxygen containing plasma, followed by a wet cleanup to remove any organic residue from the top surface of the IC (700).

FIG. 7B depicts the IC (700) during a GRTD halo ion implantation process. A GRTD halo photoresist pattern (722) is formed on top surfaces of the NMOS region (703) and PMOS region (705) to expose the GRTD region (704) using known photolithographic methods. A GRTD halo set of p-type dopants (723), preferably boron, a portion of which is commonly in the form BF$_2$, and possibly gallium or indium, is ion implanted into the top layer of the p-well (706) adjacent to the GRTD gate (712), preferably at a total dose between $1 \cdot 10^{13}$ and $3 \cdot 10^{14}$ atoms/cm$^2$, to form a p-type source GRTD halo implanted region (724) and a p-type drain GRTD halo implanted region (725). As with other halo implants, the GRTD halo set of p-type dopants (723) is preferably ion implanted in two or four subdoses, wherein each subdose is ion implanted at an angle of 10 to 30 degrees from a vertical axis of the IC (700), and rotated about the vertical axis to provide a uniform concentration of p-type dopants in the GRTD halo implanted regions (724, 325) on all sides of the GRTD gate (712). The GRTD halo photoresist pattern (722) is removed using known methods, for example by exposing the IC (700) to an oxygen containing plasma, followed by a wet cleanup to remove any organic residue from the top surface of the IC (700).

FIG. 7C depicts the IC (700) at a subsequent stage of fabrication. An NLDD anneal operation is performed on the IC (700), using known methods of rapid thermal processing (RTP) or laser annealing, to activate a portion of the NLDD set of n-type dopants, NMOS halo set of p-type dopants and GRTD halo set of p-type dopants to form NLDD annealed regions (726) and NMOS halo annealed regions (727) in the NMOS transistor region (703), and a source GRTD halo annealed region (728) and a drain GRTD halo annealed region (729) in the GRTD region (704).

Still referring to FIG. 7C, PLDD annealed regions (730) and PMOS halo annealed regions (731) are formed in the PMOS region (705). The PLDD annealed regions (730) are formed by defining PLDD regions using known photolithographic methods, ion implanting a PLDD set of p-type dopants, typically boron, a portion of which is commonly in the form BF$_2$, and possibly including gallium or indium, into a top layer of the n-well (707) adjacent to the PMOS offset spacers (716), at a total dose typically between $1 \cdot 10^{13}$ and $5 \cdot 10^{14}$ atoms/cm$^2$, to a depth in the n-well (707) between 10 and 50 nanometers, to form PLDD implanted regions. The PMOS halo annealed regions (731) are formed by ion implanting a PMOS halo set of n-type dopants, typically phosphorus, and commonly including arsenic, into the top layer of the n-well (707), typically at a total dose between $1 \cdot 10^{12}$ and $3 \cdot 10^{13}$ atoms/cm$^2$, adjacent to the PLDD implanted regions to form PMOS halo implanted regions. A PLDD anneal operation, using known RTP or laser annealing methods, is performed on the IC (700) which activates a portion of the PLDD set of p-type dopants and PMOS halo set of n-type dopants in the PLDD implanted regions and PMOS halo implanted regions to form PLDD annealed regions (730) and PMOS halo annealed regions (731), respectively.

Continuing to refer to FIG. 7C, NMOS gate sidewall spacers (732), typically silicon nitride or layers of silicon nitride and silicon dioxide, between 30 and 80 nanometers thick are formed on lateral surfaces of the NMOS offset spacers (714), commonly by known methods of conformal deposition of a layer of silicon nitride or layers of silicon nitride and silicon dioxide, followed by an anisotropic etch which removes the conformally deposited material from top surfaces of the NMOS gate (711) and NLDD annealed regions (726) to leave the NMOS gate sidewall spacers (732) on the lateral surfaces of the NMOS offset spacers (714) and the top surface of the p-well (706) immediately adjacent to the NMOS offset spacers (714). Similarly, a source GRTD gate sidewall spacer (733), a drain GRTD gate sidewall spacer (734) and PMOS gate sidewall spacers (735), of similar materials and dimensions to the NMOS gate sidewall spacers (732), are formed on lateral surfaces of the GRTD offset spacers (715) and on lateral surfaces of the PMOS offset spacers (716), respectively. An NSD photoresist pattern (736) is formed on top surfaces of the PLDD annealed regions (730) and PMOS gate (713), exposing the NMOS region (703) and GRTD region (704). An NSD set of n-type dopants (737), typically phosphorus, and commonly including arsenic, is ion implanted into the top region of the p-well (706) adjacent to the NMOS gate sidewall spacers (732), the source GRTD gate sidewall spacer (733) and the drain GRTD gate sidewall spacer (734), at a total dose typically between $1 \cdot 10^{14}$ and $5 \cdot 10^{16}$ atoms/cm$^2$, to a depth in the p-well (706) between 25 and 250 nanometers, to form NMOS NSD implanted regions (738), a source GRTD implanted region (739) and a drain GRTD implanted region (740). The NSD photoresist pattern (736) blocks the NSD set of n-type dopants (737) from areas where the NSD set of n-type dopants is not desired, for example, areas defined for PMOS transistors. The NSD photoresist pattern (736) is removed, commonly by exposing the IC (700) to an oxygen containing plasma, followed by a wet cleanup to remove any organic residue from the top surface of the IC (700).

Figure 7D:
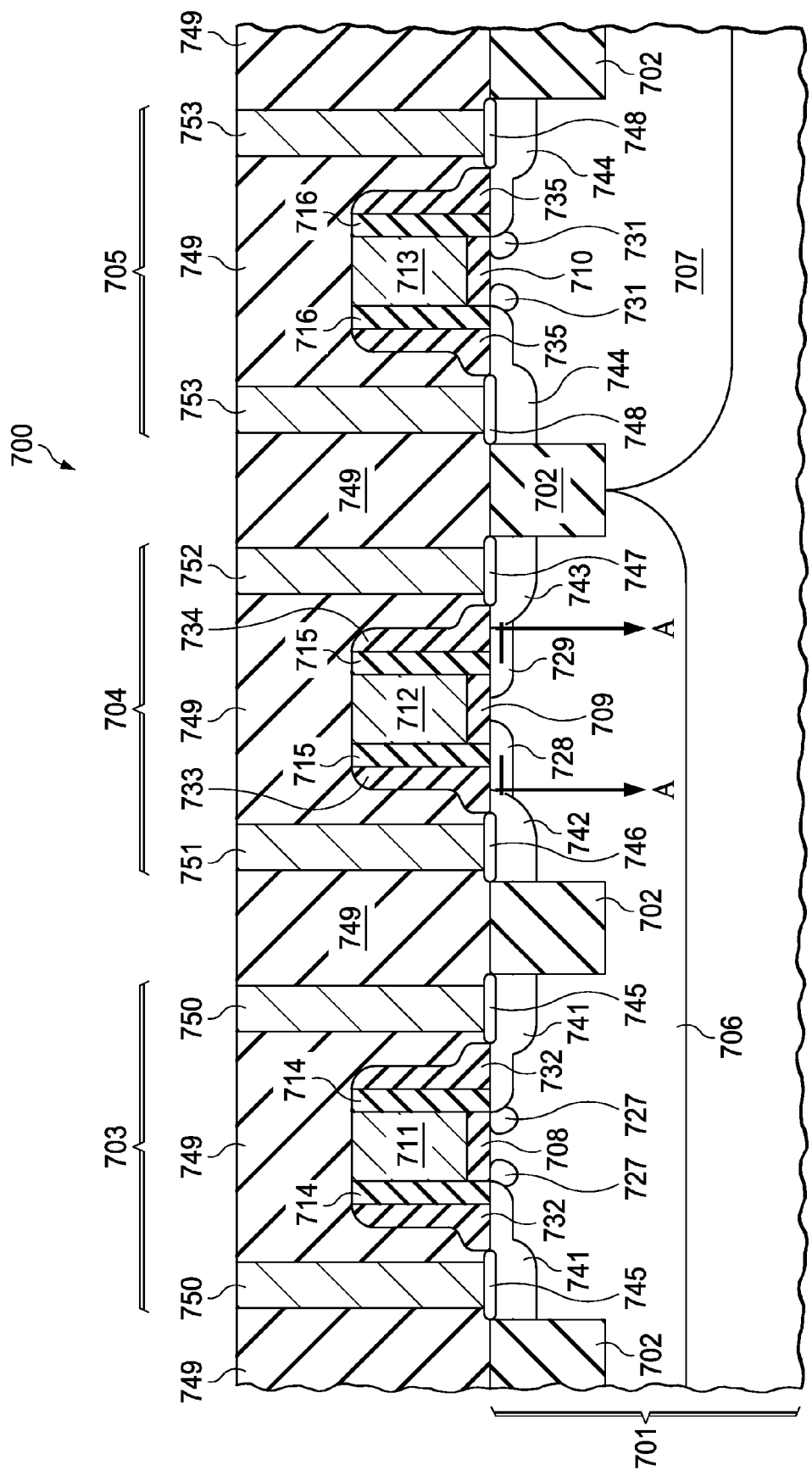

FIG. 7D depicts the IC (700) after fabrication of the NMOS transistor, GRTD and PMOS transistor is substantially completed, and contacts have been formed on the source and drain nodes of the NMOS transistor, GRTD and PMOS transistor. PSD implanted regions are formed in the PMOS region (705) by ion implanting a PSD set of p-type dopants, typically boron, and possibly gallium or indium, into the top region of the n-well (707) adjacent to the PMOS gate sidewall spacers (735) at a total dose typically between $1 \cdot 10^{14}$ and $5 \cdot 10^{16}$ atoms/cm$^2$, to a depth in the n-well (707) between 25 and 250 nanometers. A source/drain anneal operation is performed on the IC (700) using known RTP or laser annealing methods which activates a portion of the NSD set of n-type dopants so as to transform the NLDD annealed regions (726) and NSD implanted regions (738) depicted in FIG. 7C into NSD regions (741) in the NMOS transistor region (703), transform the n-type GRTD source implanted region (739) depicted in FIG. 1C into an n-type GRTD source region (742), and transform the GRTD drain implanted region (740) depicted in FIG. 7C into an n-type GRTD drain region (743). The source/drain anneal operation also activates a portion of the PSD set of p-type dopants so as to transform the PLDD annealed regions (730) depicted in FIG. 7C and the PSD implanted regions into PSD regions (744) in the PMOS transistor region (705).

Still referring to FIG. 7D, it is common to replace the polysilicon in the NMOS gate (711), GRTD gate (712) and PMOS gate (713) with a metal or a metal silicide, as described in reference to FIG. 1D. Metal silicide layers are formed on the NSD regions (741), GRTD source region (742), GRTD drain region (743), and PSD regions (744) by known methods, as described in reference to FIG. 1D, to form NSD silicide layers (745), a GRTD source silicide layer (746), a GRTD drain silicide layer (747) and PSD silicide layers (748).

Continuing to refer to FIG. 7D, a PMD layer (749), with the properties described in reference to FIG. 1D, is formed on a top surface of the IC (700). NMOS source and drain contacts (750), a GRTD source contact (751), a GRTD drain contact (752) and PMOS source and drain contacts (753), which make electrical connections to the NSD silicide layers (745), GRTD source silicide layer (746), a GRTD drain silicide layer (747) and PSD silicide layers (748), respectively, are formed in the PMD layer (749) by known methods, as described in reference to FIG. 1D. Contacts are also formed to make electrical connections to the NMOS gate (711), GRTD gate (712) and PMOS gate (713), but are not shown in FIG. 7D for clarity.

Figure 8:
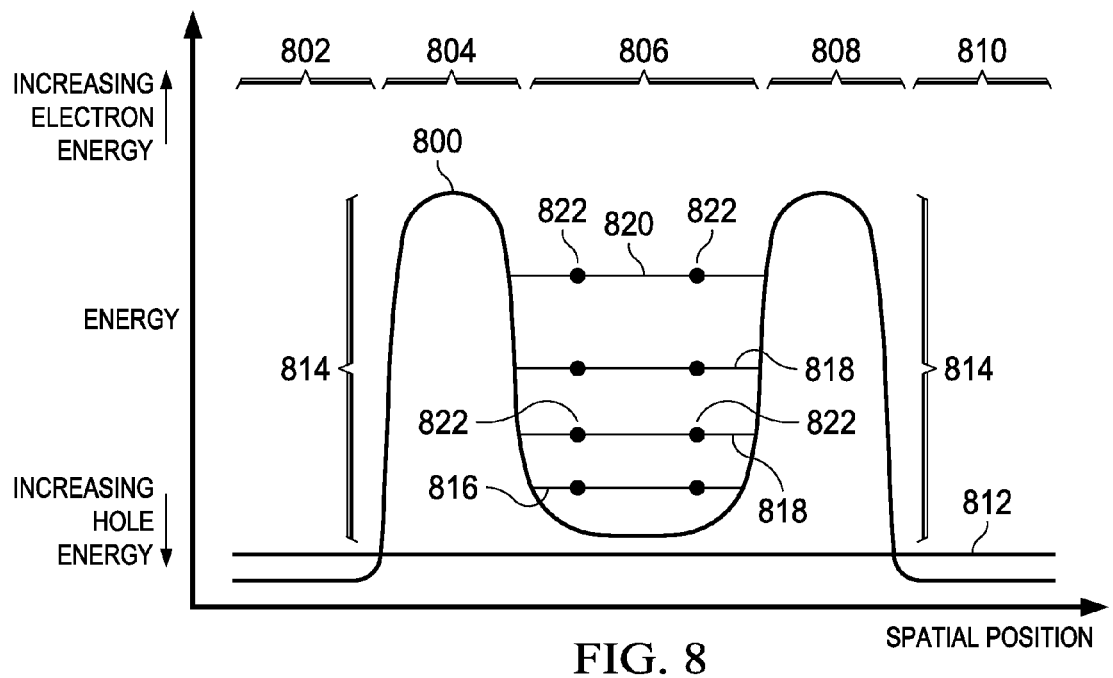
FIG. 8 is an energy band diagram of GRTD elements as recited in the second embodiment discussed in reference to FIG. 7A through FIG. 7D.

FIG. 8 is an energy band diagram of GRTD elements as recited in the second embodiment discussed in reference to FIG. 7A through FIG. 7D, for example along section line A-A in FIG. 7D. The GRTD gate is biased with respect to a p-well containing the GRTD to form an n-type quantum well in a region below the GRTD gate dielectric layer. A conduction band edge (800) is plotted through an n-type GRTD source region (802), a p-type GRTD source halo region (804), a quantum well region (806), a p-type GRTD drain halo region (808) and an n-type GRTD drain region (810). The p-well containing the GRTD and the GRTD drain region (810) are biased at zero volts with respect to the GRTD source region (802). The GRTD source region (802) and GRTD drain region (810) are degenerately doped, causing the conduction band edge (800) to be lower in energy than a Fermi level (812). A p-type dopant density above $10^{19}$ cm$^{-3}$ in the GRTD source halo region (804) and GRTD drain halo region (808) causes the conduction band edge (800) to form electron energy barriers (814) on each side of the quantum well region (806). An energy depth of the quantum well region (806) is a function of the GRTD gate bias with respect to the GRTD source region, and in a preferred embodiment, is more than 400 meV. The quantum well supports discrete electron energy levels, including a lowest energy level (816), intermediate energy levels (818) and a maximum energy level (820). In embodiments of the GRTD with lateral dimensions of the quantum well region (806) preferably less than 15 nanometers but possibly as much as 20 nanometers, separation between energy levels (816, 818, 820) may be more than 50 meV. This is advantageous because energy levels separated by more than 50 meV may be individually accessed at room temperature. Each energy level (816, 818, 820) holds a precise number of electrons (822).

Figure 9:
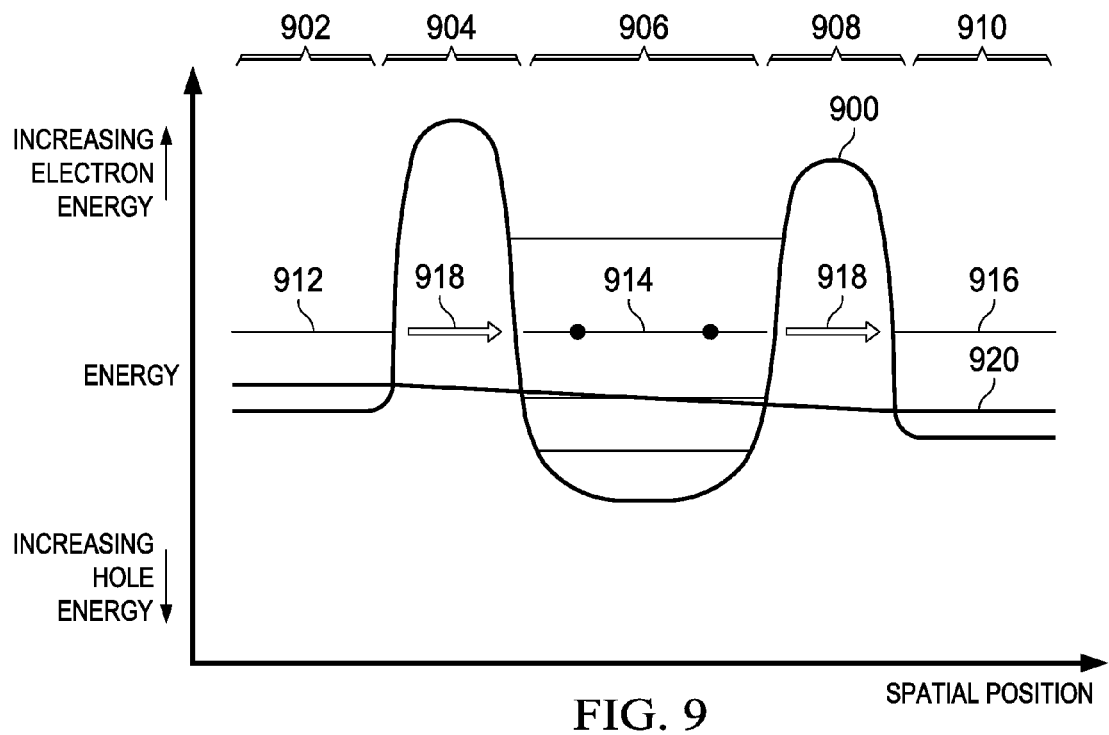
FIG. 9 is a band diagram of GRTD elements as recited in the second embodiment discussed in reference to FIG. 7A through FIG. 7D, depicting operation of the GRTD in a negative conductance mode.

FIG. 9 is a band diagram of GRTD elements as recited in the second embodiment discussed in reference to FIG. 7A through FIG. 7D, depicting operation of the GRTD in a negative conductance mode. A conduction band edge (900) is plotted through an n-type GRTD source region (902), a p-type GRTD source halo region (904), a quantum well region (906) formed by appropriately biasing a GRTD gate with respect to the GRTD source region (902), a p-type GRTD drain halo region (908) and an n-type GRTD drain region (910). The GRTD drain region (910) is positively biased between 1 and 10 millivolts with respect to the GRTD source region (902). A gate node of the GRTD is biased positively with respect to the GRTD source region (902) so that an electron energy level (914) in the quantum well region (906) is lowered to be substantially aligned to an unpopulated energy level (916) in the GRTD drain region (910) and a populated source side electron energy level (912) in the GRTD source region (902). Resonant tunneling of electrons in the populated source side electron energy level (912) through the quantum well electron energy level (914) to the empty drain side electron energy level (916) occurs, as depicted by the electron tunneling arrows (918). A Fermi level (920) depicts the effect of the drain bias by a slope in the quantum well region (906). Operating the embodiment described in reference to FIG. 7A through FIG. 7D in the manner described in reference to FIG. 9 causes the GRTD to desirably exhibit negative resistance, which is advantageous in a variety of circuits, including oscillators and amplifiers.

Figure 10A:
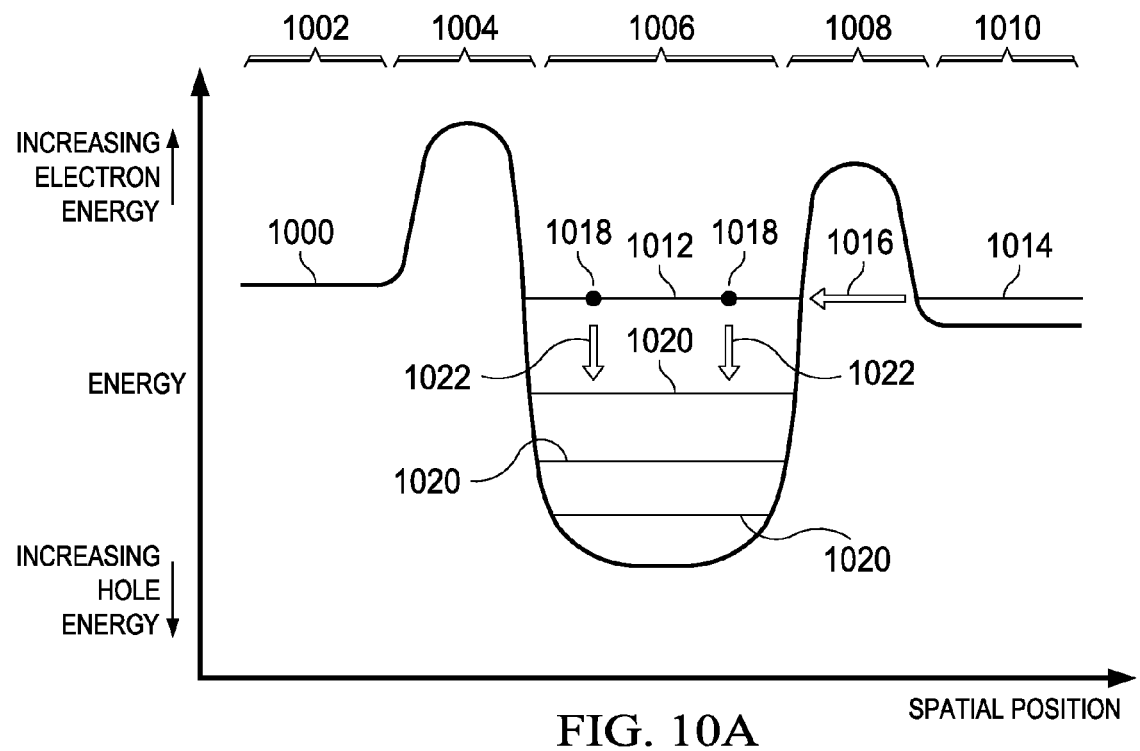
FIG. 10A and FIG. 10B are band diagrams of GRTD elements as recited in the second embodiment discussed in reference to FIG. 7A through FIG. 7D, depicting operation of the GRTD in a charge pump mode.
Figure 10B:
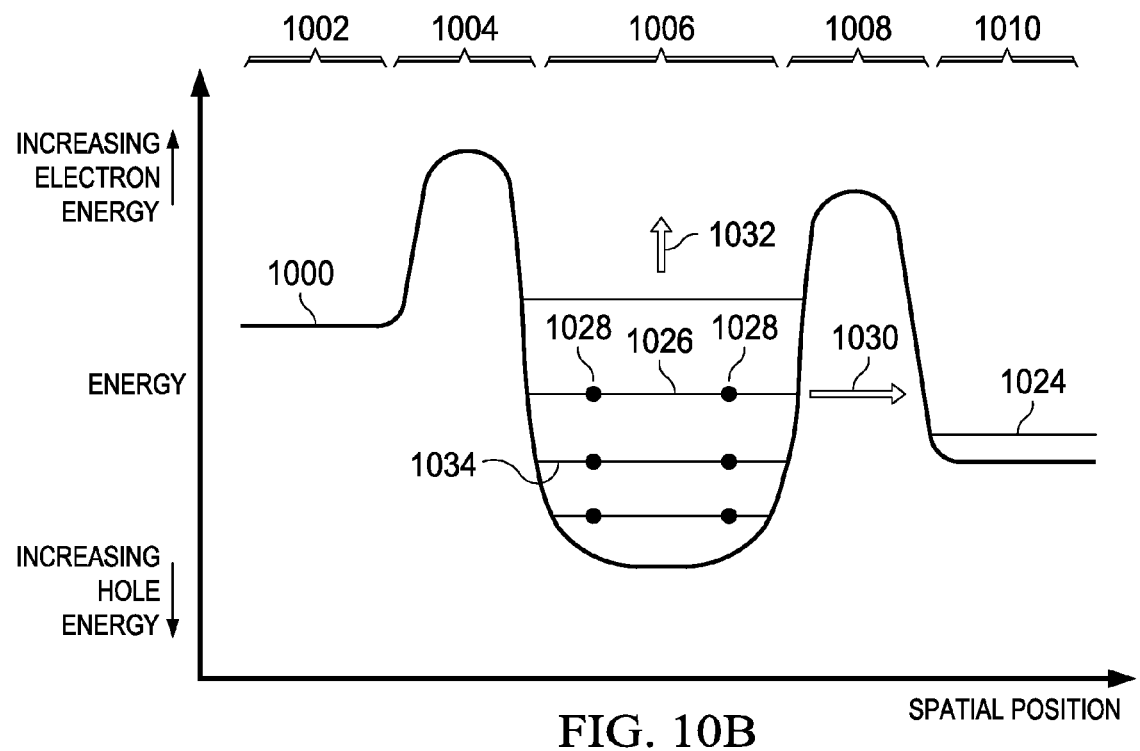

FIG. 10A and FIG. 10B are band diagrams of GRTD elements as recited in the second embodiment discussed in reference to FIG. 7A through FIG. 7D, depicting operation of the GRTD in a charge pump mode. FIG. 10A depicts a quantum well filling operation. A conduction band edge (1000) is plotted through an n-type GRTD source region (1002), a p-type GRTD source halo region (1004), a quantum well region (1006), formed by appropriately biasing a GRTD gate with respect to the GRTD source region (1002) such that electron energy levels in the quantum well region (1006) are below the conduction band edge (1000) in the GRTD source region (1002), a p-type GRTD drain halo region (1008) and an n-type GRTD drain region (1010). The GRTD drain region (1010) is positively biased with respect to the GRTD source region (1002) to align a populated electron energy level (1014) in the GRTD drain region (1010) with a top electron energy level (1012) in the quantum well region (1006). Electrons in the populated electron energy level (1014) tunnel through the p-type GRTD drain halo region (1008) to the top energy level (1012) in the quantum well region (1006), as depicted by the electron tunneling arrow (1016). Electrons (1018) in the top energy level (1012) in the quantum well region (1006) transition to lower energy levels (1020) in the quantum well region (1006), as depicted by the electron transition arrows (1022). A Fermi level is not shown in FIG. 10A for clarity.

FIG. 10B depicts a quantum well emptying operation. The bias on the GRTD drain region (1010) is increased so that an unpopulated electron energy level (1024) in the GRTD drain region (1010) is raised to be substantially equal to the top filled energy level (1026) in the quantum well region (1006). Electrons (1028) in the top filled energy level (1026) tunnel through the p-type GRTD drain halo region (1008) to the unpopulated electron energy level (1024), as depicted by the electron tunneling arrow (1030). After the top filled energy level (1026) is emptied, the bias on the GRTD gate is adjusted to reduce an energy depth of the quantum well region (1006), which results in the energy levels in the quantum well region (1006) rising with respect to the unpopulated electron energy level (1024), as depicted by energy level transition arrow (1032), until a next populated energy level (1034) in the quantum well region (1006) is substantially equal to the unpopulated electron energy level (1024). The steps of emptying an energy level by tunneling through the p-type GRTD drain halo region (1008) to the unpopulated electron energy level (1024), and raising the energy levels in the quantum well region (1006) to align a next populated energy level with the unpopulated electron energy level (1024) are repeated until a desired quantity of charge is removed from the quantum well region (1006).

Figure 11:
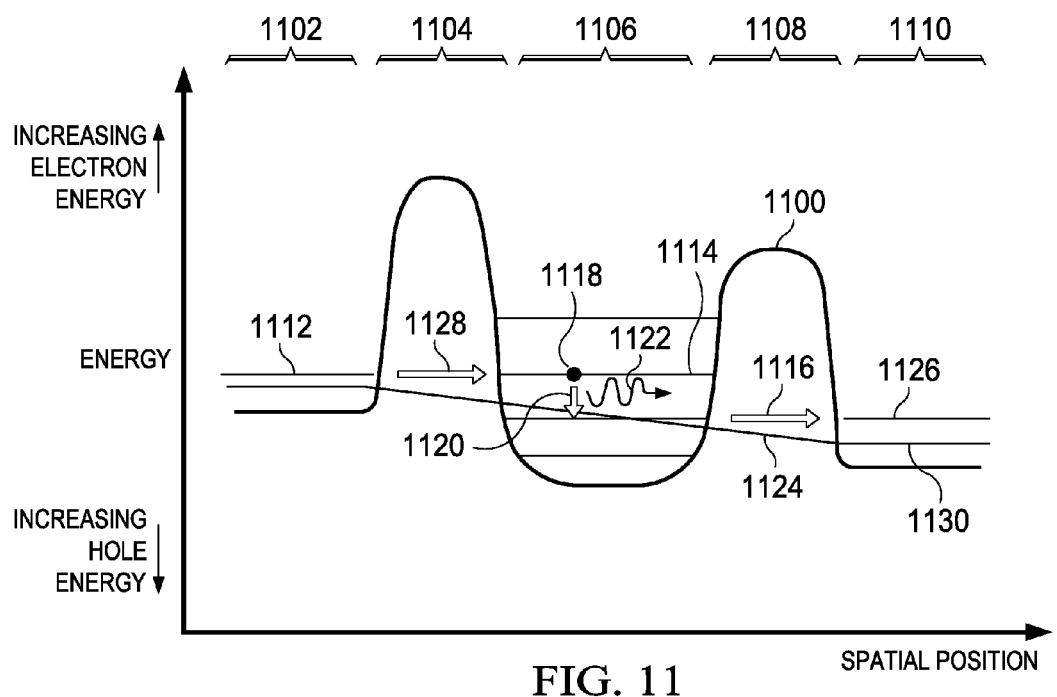
FIG. 11 is a band diagram of GRTD elements as recited in the second embodiment discussed in reference to FIG. 7A through FIG. 7D, depicting operation of the GRTD in a radiative emission mode.

FIG. 11 is a band diagram of GRTD elements as recited in the second embodiment discussed in reference to FIG. 7A through FIG. 7D, depicting operation of the GRTD in a radiative emission mode. A conduction band edge (1100) is plotted through an n-type GRTD source region (1102), a p-type GRTD source halo region (1104), a quantum well region (1106) formed by appropriately biasing a GRTD gate with respect to the GRTD source region (1102) such that a first electron energy level (1114) in the quantum well region (1106) is substantially aligned with a populated electron energy level (1112) in the GRTD source region (1102), and an n-type GRTD drain region (1110). The GRTD drain region (1110) is positively biased with respect to the GRTD source region (1102) so that an unpopulated electron energy level (1126) in the GRTD drain region (1110) is substantially aligned to an intermediate energy level (1124) in the quantum well region (1106) which is energetically below the first electron energy level (1114). Tunneling of an electron in the GRTD source region (1102) to the first energy level (1114) occurs, as depicted by a first electron tunneling arrow (1128). The electron (1118) in the first energy level (1114) drops to a intermediate energy level (1124) which is lower in energy than the first energy level (1114), as depicted by an second electron transition arrow (1120) and desirably emits a photon (1122) which has an energy equal to a difference in energy between the first energy level (1114) and the intermediate energy level (1124). The electron (1118) subsequently tunnels from the intermediate energy level (1124) to an empty drain side energy level (1126) in the GRTD drain region (1110), as depicted by a second electron tunneling arrow (1116). Radiative emission is advantageous in a variety of circuits including sensors and communication circuits. A Fermi level (1130) depicts the effect of the drain bias by a slope in the quantum well region (1106).

Figure 12A:
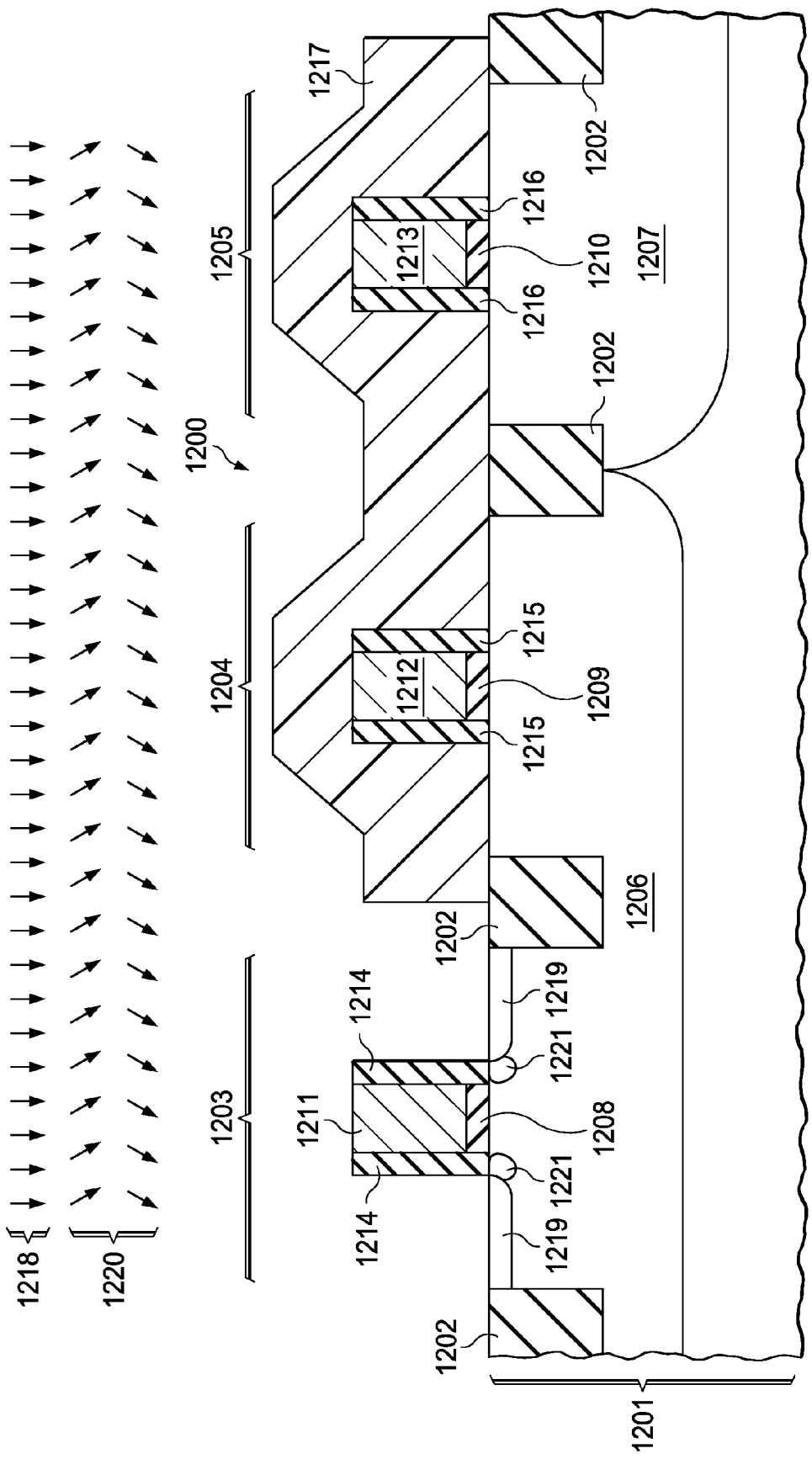
FIG. 12A through FIG. 12D are cross-sections of a CMOS IC including a GRTD formed according to a third embodiment of the instant invention, depicted in successive stages of fabrication.
Figure 12B:
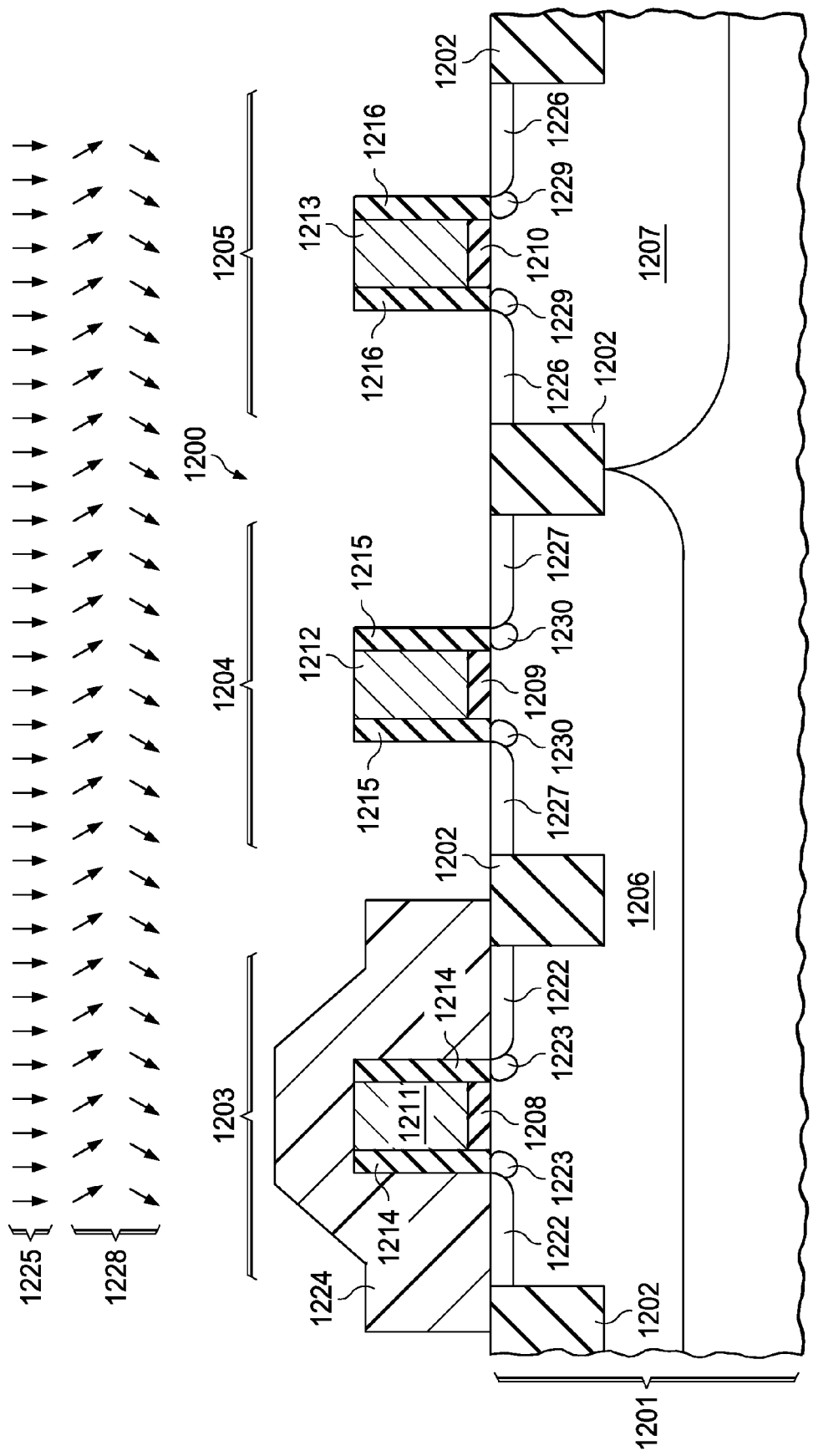
Figure 12C:
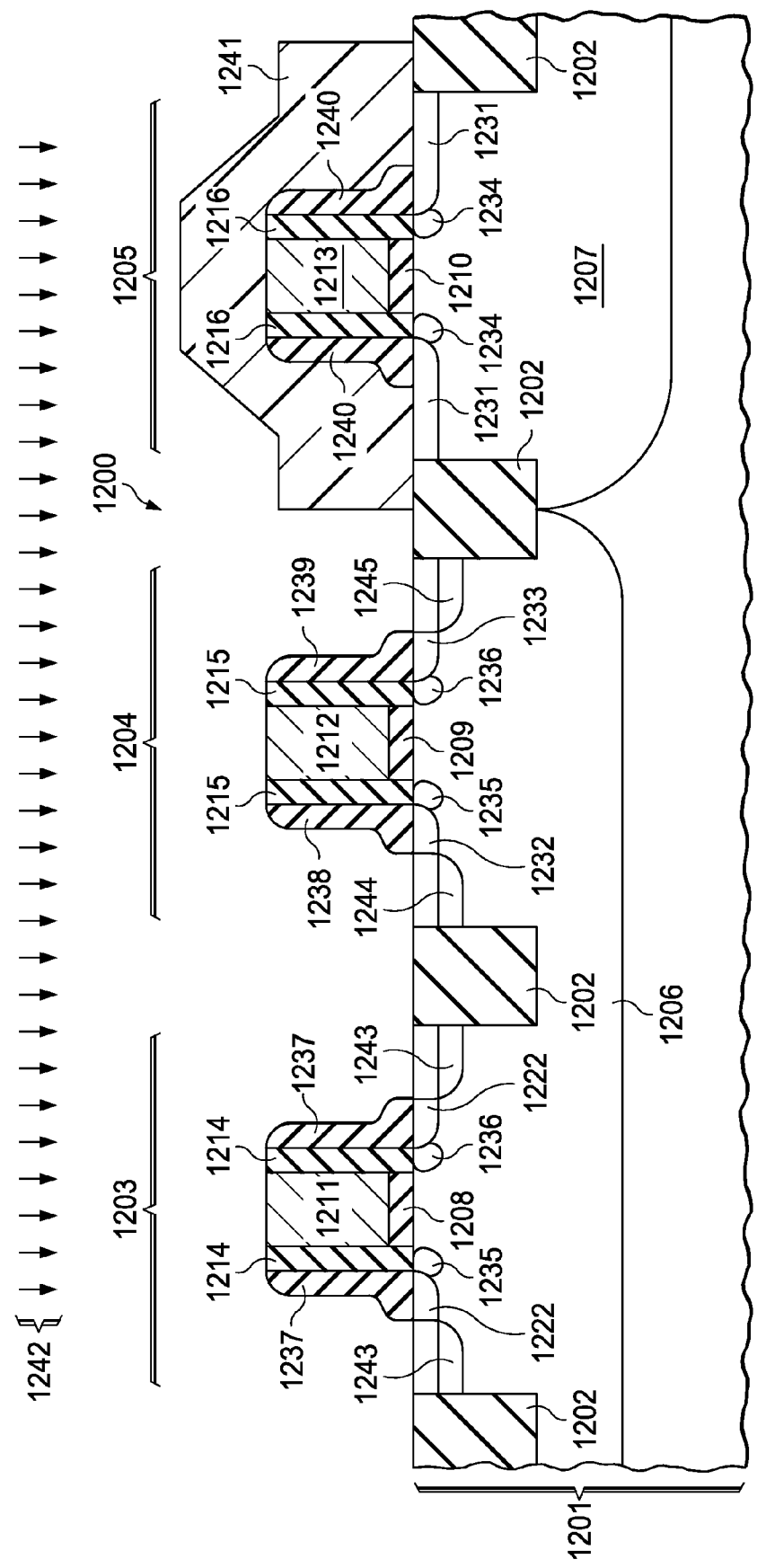

FIG. 12A through FIG. 12C are cross-sections of a CMOS IC including a GRTD formed according to a third embodiment of the instant invention, depicted in successive stages of fabrication. Referring to FIG. 12A, the IC (1200) is formed in a semiconductor substrate (1201) with the properties described in reference to FIG. 1A. Elements of field oxide (1202) are formed in the substrate (1201) by an STI process, separating an NMOS region (1203), a GRTD region (1204) and a PMOS region (1205). A p-well (1206) is formed in the substrate (1201) in the NMOS region (1203) and the GRTD region (1204) as described in reference to FIG. 1A. Similarly, an n-well (1207) is formed in the substrate (1201) in the PMOS region (1205) as described in reference to FIG. 1A. An NMOS gate dielectric layer (1208), a GRTD gate dielectric layer (1209) and a PMOS gate dielectric layer (1210) are formed on top surfaces of the substrate (1201), with the properties described in reference to FIG. 1A, in the NMOS region (1203), the GRTD region (1204) and the PMOS region (1205), respectively. An NMOS gate (1211), a GRTD gate (1212) and a PMOS gate (1213) are formed on top surfaces of the NMOS gate dielectric layer (1208), the GRTD gate dielectric layer (1209) and the PMOS gate dielectric layer (1210), respectively, as described in reference to FIG. 1A. NMOS offset spacers (1214), GRTD offset spacers (1215) and PMOS offset spacers (1216) are formed on lateral surfaces of the NMOS gate (1211), the GRTD gate (1212) and the PMOS gate (1213), as described in reference to FIG. 1A.

Continuing to refer to FIG. 12A, an NLDD photoresist pattern (1217) is formed on top surfaces of the n-well (1207), PMOS gate (1213), p-well (1206) in the GRTD region (1204) and the GRTD gate (1212), using known photolithographic methods. An NLDD set of n-type dopants (1218), typically phosphorus and arsenic, and possibly antimony, is ion implanted into a top layer of the p-well (1206) adjacent to the NMOS offset spacers (1214) at a total dose typically between $1 \cdot 10^{13}$ and $5 \cdot 10^{14}$ atoms/cm$^2$, to a depth in the p-well (1206) between 10 and 50 nanometers, to form NLDD implanted regions (1219) in the NMOS transistor region (1203). The NLDD photoresist pattern (1217) blocks the NLDD set of n-type dopants (1218) from areas where the NLDD set of n-type dopants is not desired, for example, the GRTD region (1204) and PMOS region (1205). While the NLDD photoresist pattern (1217) is in place, an NMOS halo set of p-type dopants (1220), typically boron, a portion of which is commonly in the form BF$_2$, and possibly gallium or indium, is ion implanted into the top layer of the p-well (1206), typically at a total dose between $1 \cdot 10^{12}$ and $3 \cdot 10^{13}$ atoms/cm$^2$, to form p-type NMOS halo implanted regions (1221) laterally abutting the NLDD implanted regions (1219). The NMOS halo set of p-type dopants (1220) is typically ion implanted in two or four subdoses, wherein each subdose is ion implanted at an angle of 10 to 30 degrees from a vertical axis of the IC (1200), and rotated about the vertical axis to provide a uniform concentration of p-type dopants in the NMOS halo implanted regions (1221) on all sides of the NMOS gate (1211). The NLDD photoresist pattern (1217) is removed, commonly by exposing the IC (1200) to an oxygen containing plasma, followed by a wet cleanup to remove any organic residue from the top surface of the IC (1200).

FIG. 12B depicts the IC (1200) at a further stage of fabrication. An NLDD anneal operation is performed on the IC (1200), using known methods of rapid thermal processing (RTP) or laser annealing, to activate a portion of the NLDD set of n-type dopants and NMOS halo set of p-type dopants to form NLDD annealed regions (1222) and NMOS halo annealed regions (1223) in the NMOS transistor region (1203).

Continuing to refer to FIG. 12B, a PLDD photoresist pattern (1224) is formed on top surfaces of the p-well (1206) in the NMOS region (1203) and the NMOS gate (1211), using known photolithographic methods. A PLDD set of n-type dopants (1225), preferably boron, a portion of which is commonly in the form BF$_2$, and possibly including gallium or indium, into a top layer of the n-well (1207) adjacent to the PMOS offset spacers (1216), and into the p-well (1206) adjacent to the GRTD offset spacers (1215), at a total dose typically between $1 \cdot 10^{13}$ and $5 \cdot 10^{14}$ atoms/cm$^2$, to a depth in the n-well (1207) and the p-well (1206) between 10 and 50 nanometers, to form PLDD implanted regions (1226) and GRTD LDD regions (1227), respectively. The PLDD photoresist pattern (1224) blocks the PLDD set of p-type dopants (1225) from areas where the PLDD set of n-type dopants is not desired, for example, the NMOS region (1203). While the PLDD photoresist pattern (1224) is in place, a PMOS halo set of p-type dopants (1228), preferably phosphorus, and possibly including arsenic, is ion implanted into the top layer of the n-well (1207) adjacent to the PMOS offset spacers (1216), and into the p-well (1206) adjacent to the GRTD offset spacers (1215), typically at a total dose between $1 \cdot 10^{12}$ and $3 \cdot 10^{13}$ atoms/cm$^2$, to form n-type PMOS halo implanted regions (1229) laterally abutting the PLDD implanted regions (1226) and to form n-type GRTD halo implanted regions (1230) laterally abutting the GRTD LDD implanted regions (1227). The PMOS halo set of n-type dopants (1228) is typically ion implanted in two or four subdoses, wherein each subdose is ion implanted at an angle of 10 to 30 degrees from a vertical axis of the IC (1200), and rotated about the vertical axis to provide a uniform concentration of n-type dopants in the PMOS halo implanted regions (1229) on all sides of the PMOS gate (1213) and in the GRTD halo implanted regions (1230) on all sides of the GRTD gate (1212). The PLDD photoresist pattern (1224) is removed using known methods, for example by exposing the IC (1200) to an oxygen containing plasma, followed by a wet cleanup to remove any organic residue from the top surface of the IC (1200).

FIG. 12C depicts the IC (1200) at a further stage of fabrication. A PLDD anneal operation, using known RTP or laser annealing methods, is performed on the IC (1200) which activates a portion of the PLDD set of p-type dopants in the PLDD implanted regions and GRTD LDD implanted regions to form PLDD annealed regions (1231), a GRTD LDD source annealed region (1232) and a GRTD LDD drain annealed region (1233), respectively, and which activates a portion of the PMOS halo set of n-type dopants in the PMOS halo implanted regions and the GRTD halo implanted regions to form PMOS halo annealed regions (1234), a GRTD halo source annealed region (1235) and a GRTD halo drain annealed region (1236). NMOS gate sidewall spacers (1237), typically silicon nitride or layers of silicon nitride and silicon dioxide, between 30 and 80 nanometers thick are formed on lateral surfaces of the NMOS offset spacers (1214), commonly by known methods of conformal deposition of a layer of silicon nitride or layers of silicon nitride and silicon dioxide, followed by an anisotropic etch which removes the conformally deposited material from top surfaces of the NMOS gate (1211) and NLDD annealed regions (1222) to leave the NMOS gate sidewall spacers (1237) on the lateral surfaces of the NMOS offset spacers (1214) and the top surface of the p-well (1206) immediately adjacent to the NMOS offset spacers (1214). Similarly, a source GRTD gate sidewall spacer (1238), a drain GRTD gate sidewall spacer (1239) and PMOS gate sidewall spacers (1240), of similar materials and dimensions to the NMOS gate sidewall spacers (1237), are formed on lateral surfaces of the GRTD offset spacers (1215) and on lateral surfaces of the PMOS offset spacers (1216), respectively.

Continuing to refer to FIG. 12C, an NSD photoresist pattern (1241) is formed on top surfaces of the PLDD annealed regions (1231) and PMOS gate (1213), exposing the NMOS region (1203) and GRTD region (1204). An NSD set of n-type dopants (1242), preferably phosphorus, and possibly including arsenic, is ion implanted into the top region of the p-well (1206) adjacent to the NMOS gate sidewall spacers (1237), the source GRTD gate sidewall spacer (1238) and the drain GRTD gate sidewall spacer (1239), at a total dose typically between $1 \cdot 10^{14}$ and $5 \cdot 10^{16}$ atoms/cm$^2$, to a depth in the p-well (1206) between 25 and 250 nanometers, to form NMOS NSD implanted regions (1243), a source GRTD implanted region (1244) and a drain GRTD implanted region (1245). The NSD photoresist pattern (1241) blocks the NSD set of n-type dopants (1242) from areas where the NSD set of n-type dopants is not desired, for example, areas defined for PMOS transistors. The NSD photoresist pattern (1241) is removed, commonly by exposing the IC (1200) to an oxygen containing plasma, followed by a wet cleanup to remove any organic residue from the top surface of the IC (1200).

Figure 12D:
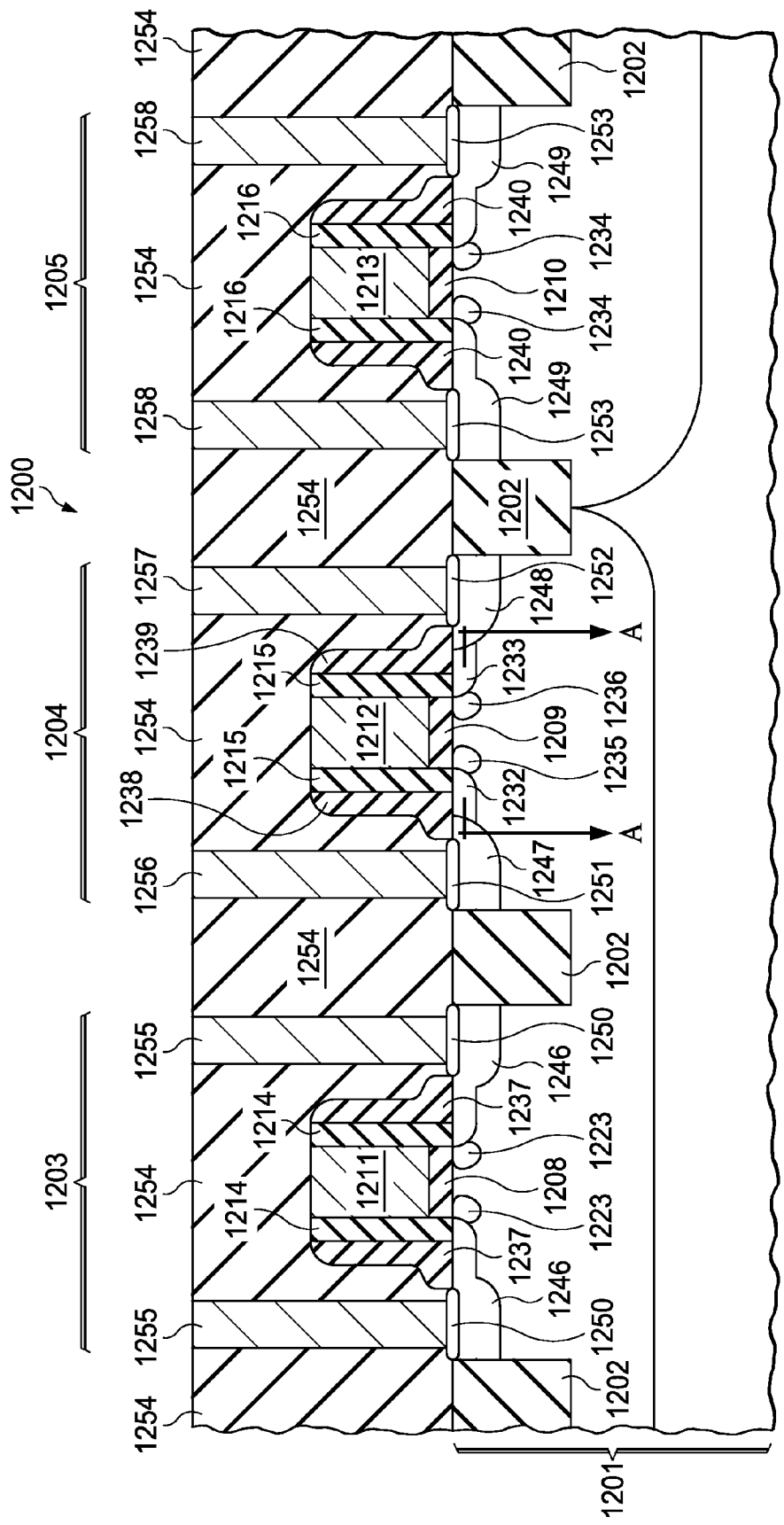

FIG. 12D depicts the IC (1200) after fabrication of the NMOS transistor, GRTD and PMOS transistor is substantially completed, and contacts have been formed on the source and drain nodes of the NMOS transistor, GRTD and PMOS transistor. PSD implanted regions are formed in the PMOS region (1205) by ion implanting a PSD set of p-type dopants, typically boron, and possibly gallium or indium, into the top region of the n-well (1207) adjacent to the PMOS gate sidewall spacers (1216) at a total dose typically between $1 \cdot 10^{14}$ and $5 \cdot 10^{16}$ atoms/cm$^2$, to a depth in the n-well (1207) between 25 and 250 nanometers. A source/drain anneal operation is performed on the IC (1200) using known RTP or laser annealing methods which activates a portion of the NSD set of n-type dopants so as to transform the NLDD annealed regions (1222) and NSD implanted regions (1243) depicted in FIG. 12C into NSD regions (1246) in the NMOS transistor region (1203), transform the n-type GRTD source implanted region (1244) depicted in FIG. 1C into an n-type GRTD source region (1247), and transform the GRTD drain implanted region (1245) depicted in FIG. 12C into an n-type GRTD drain region (1248). The source/drain anneal operation also activates a portion of the PSD set of p-type dopants so as to transform the PLDD annealed regions (1231) depicted in FIG. 12C and the PSD implanted regions into PSD regions (1249) in the PMOS transistor region (1205).

Still referring to FIG. 12D, it is common to replace the polysilicon in the NMOS gate (1211), GRTD gate (1212) and PMOS gate (1213) with a metal or a metal silicide, as described in reference to FIG. 1D. Metal silicide layers are formed on the NSD regions (1246), GRTD source region (1247), GRTD drain region (1248), and PSD regions (1249) by known methods, as described in reference to FIG. 1D, to form NSD silicide layers (1250), a GRTD source silicide layer (1251), a GRTD drain silicide layer (1252) and PSD silicide layers (1253).

Continuing to refer to FIG. 12D, a PMD layer (1254), with the properties described in reference to FIG. 1D, is formed on a top surface of the IC (1200). NMOS source and drain contacts (1255), a GRTD source contact (1256), a GRTD drain contact (1257) and PMOS source and drain contacts (1258), which make electrical connections to the NSD silicide layers (1250), GRTD source silicide layer (1251), a GRTD drain silicide layer (1252) and PSD silicide layers (1253), respectively, are formed in the PMD layer (1254) by known methods, as described in reference to FIG. 1D. Contacts are also formed to make electrical connections to the NMOS gate (1211), GRTD gate (1212) and PMOS gate (1213), but are not shown in FIG. 12D for clarity.

The embodiment described in reference to FIG. 12A through FIG. 12D is advantageous because it may be incorporated into CMOS ICs without adding fabrication steps or process complexity.

Figure 13:
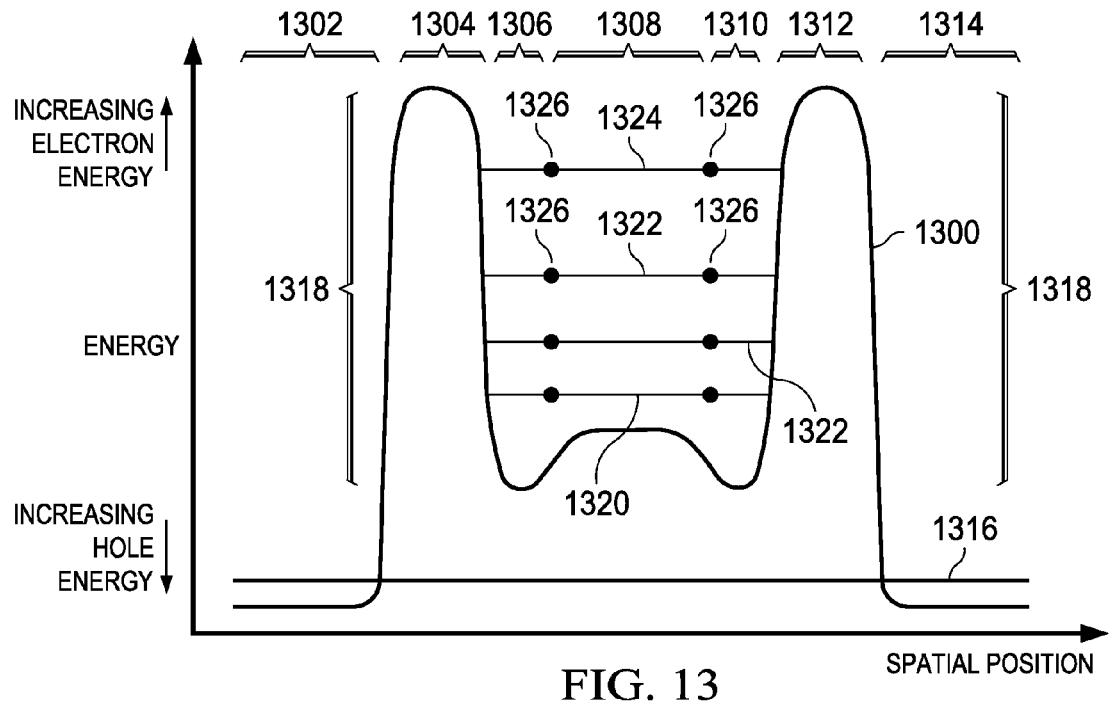
FIG. 13 is an energy band diagram of GRTD elements as recited in the third embodiment discussed in reference to FIG. 12A through FIG. 12D.

FIG. 13 is an energy band diagram of GRTD elements as recited in the third embodiment discussed in reference to FIG. 12A through FIG. 12D, for example along section line A-A in FIG. 12D. The GRTD gate is biased with respect to a p-well containing the GRTD to form an n-type layer in a region below the GRTD gate dielectric layer. A conduction band edge (1300) is plotted through an n-type GRTD source region (1302), a p-type GRTD source side LDD region (1304), an n-type GRTD source halo region (1306), an n-type channel region (1308), an n-type GRTD drain halo region (1310), a p-type GRTD drain side LDD region (1312) and an n-type GRTD drain region (1314). The p-well containing the GRTD and the GRTD drain region (1314) are biased at zero volts with respect to the GRTD source region (1302). The GRTD source region (1302) and GRTD drain region (1314) are degenerately doped, causing the conduction band edge (1300) to be lower in energy than a Fermi level (1316). The n-type GRTD source halo region (1306), n-type channel region (1308) and n-type GRTD drain halo region (1310) form a quantum well between potential barriers (1318) formed by the p-type GRTD source side LDD region (1304) and the p-type GRTD drain side LDD region (1312).

Still referring to FIG. 13, an energy depth of the quantum well is a function of the GRTD gate bias with respect to the GRTD source region, and in a preferred embodiment, is more than 400 meV. The quantum well supports discrete electron energy levels, including a lowest energy level (1320), intermediate energy levels (1322) and a maximum energy level (1324). An n-type dopant density above $10^{19}$ cm$^{-3}$ in the GRTD source halo region (1306) and GRTD drain halo region (1310) causes the quantum well to have a profile that approximates a square well, such that separations between energy levels in an upper energy region of the quantum well are desirably higher than separations between energy levels in a lower energy region of the quantum well. In embodiments of the GRTD with lateral dimensions of the quantum well preferably less than 15 nanometers but possibly as much as 20 nanometers, separation between energy levels (1320, 1222, 1224) may be more than 50 meV. This is advantageous because energy levels separated by more than 50 meV may be individually accessed at room temperature. Each energy level (1320, 1222, 1224) holds a precise number of electrons (1326).

In an alternate embodiment in which a lateral width of the GRTD gate is less than 20 nanometers, the GRTD source halo region (1306) and GRTD drain halo region (1310) may substantially join together, eliminating the channel region (1308).

Figure 14:
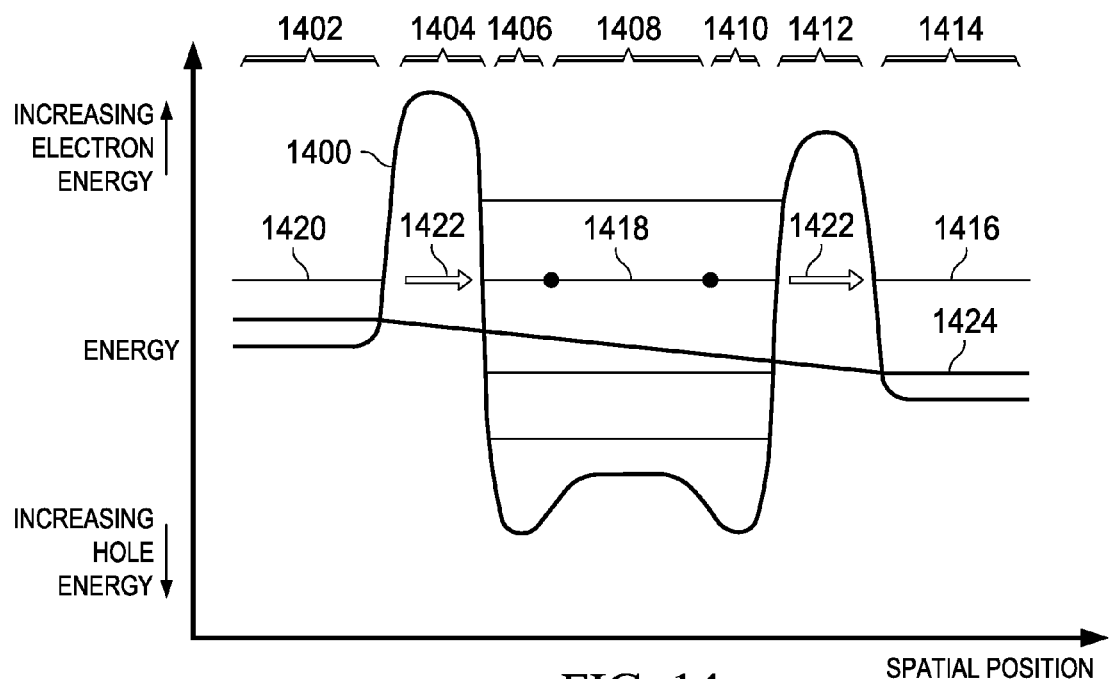
FIG. 14 is a band diagram of GRTD elements as recited in the third embodiment discussed in reference to FIG. 12A through FIG. 12D, depicting operation of the GRTD in a negative conductance mode.

FIG. 14 is a band diagram of GRTD elements as recited in the third embodiment discussed in reference to FIG. 12A through FIG. 12D, depicting operation of the GRTD in a negative conductance mode. A conduction band edge (1400) is plotted through an n-type GRTD source region (1402), a p-type GRTD source side LDD region (1404), an n-type GRTD source halo region (1406), an n-type channel region (1408) formed by appropriately biasing a GRTD gate with respect to the GRTD source region (1402), an n-type GRTD drain halo region (1410), a p-type GRTD drain side LDD region (1412) and an n-type GRTD drain region (1414). As recited in reference to FIG. 13, the n-type GRTD source halo region (1406), n-type channel region (1408) and n-type GRTD drain halo region (1410) form a quantum well between potential barriers formed by the p-type GRTD source side LDD region (1404) and the p-type GRTD drain side LDD region (1412). The GRTD drain region (1414) is positively biased between 1 and 10 millivolts with respect to the GRTD source region (1402). A gate node of the GRTD is biased positively with respect to the GRTD source region (1402) so that an electron energy level (1418) in the quantum well region is lowered to be substantially aligned to an unpopulated energy level (1416) in the GRTD drain region (1414) and a populated source side electron energy level (1420) in the GRTD source region (1402). Resonant tunneling of electrons in the populated electron energy level (1420) through the intermediate energy level (1418) to the empty source side energy level (1416) in the GRTD drain region (1414) occurs, as depicted by the electron tunneling arrows (1422). A Fermi level (1424) depicts the effect of the drain bias by a slope in the quantum well region. Operating the embodiment described in reference to FIG. 12A through FIG. 12D in the manner described in reference to FIG. 14 causes the GRTD to desirably exhibit negative resistance, which is advantageous in a variety of circuits, including oscillators and amplifiers.

Figure 15A:
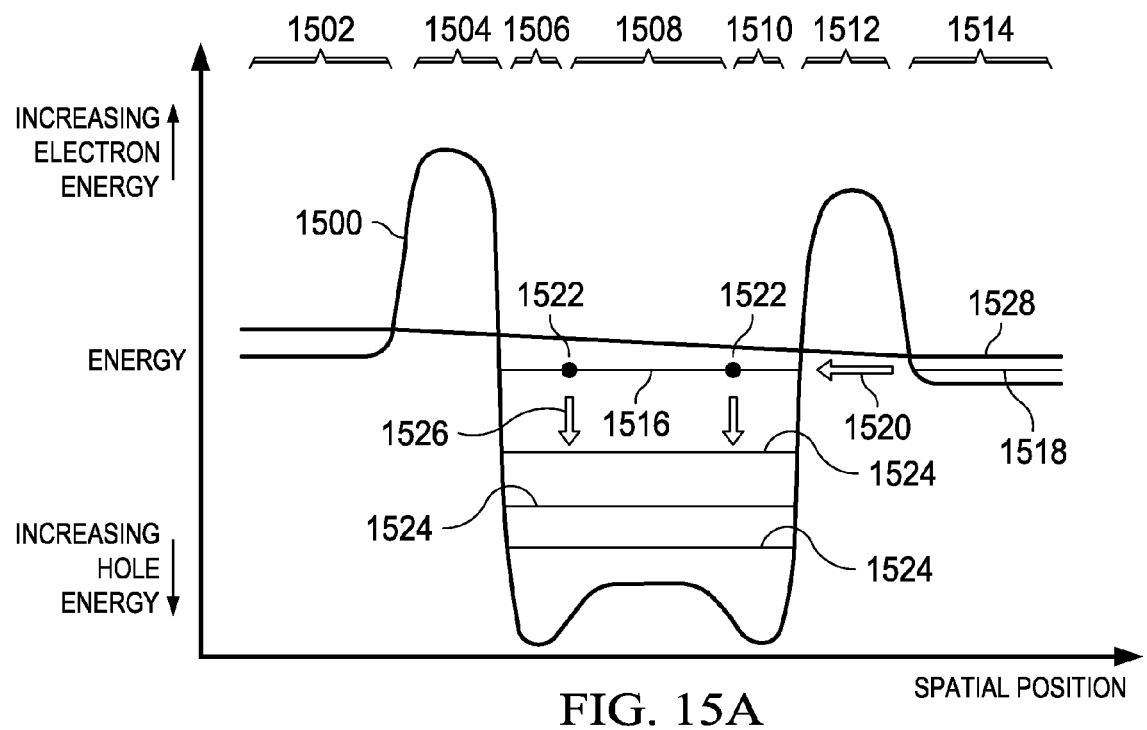
FIG. 15A and FIG. 15B are band diagrams of GRTD elements as recited in the third embodiment discussed in reference to FIG. 12A through FIG. 12D, depicting operation of the GRTD in a charge pump mode.
Figure 15B:
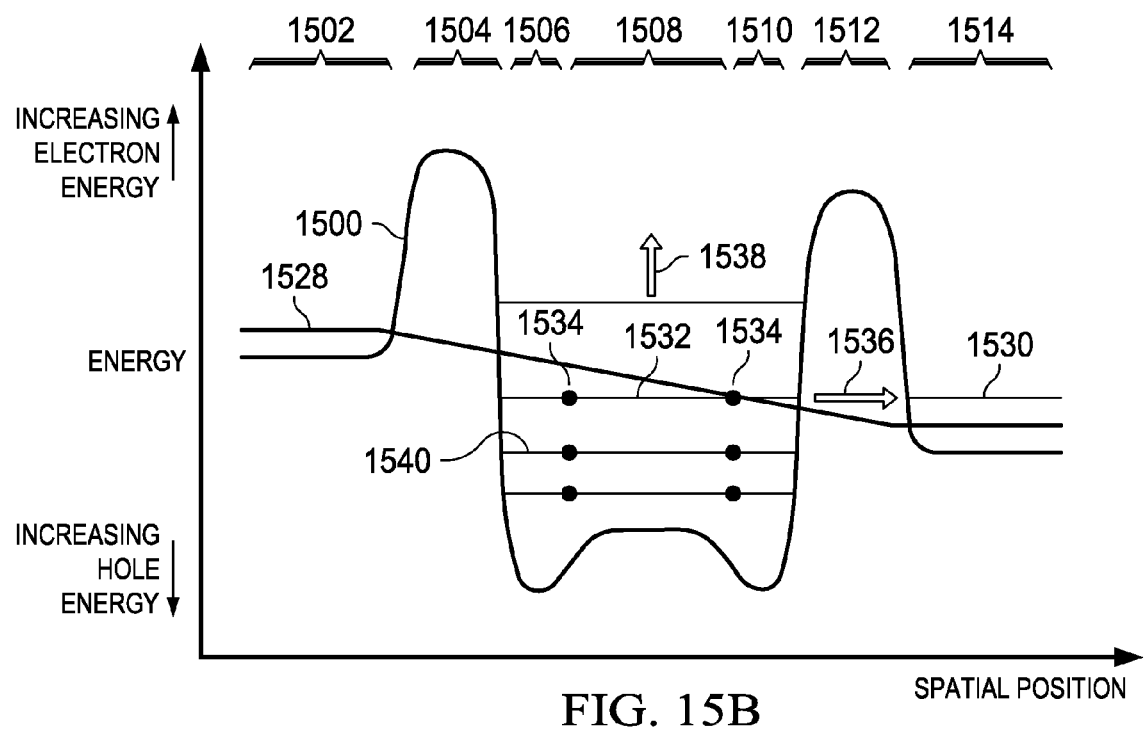

FIG. 15A and FIG. 15B are band diagrams of GRTD elements as recited in the third embodiment discussed in reference to FIG. 12A through FIG. 12D, depicting operation of the GRTD in a charge pump mode. FIG. 15A depicts a quantum well filling operation. A conduction band edge (1500) is plotted through an n-type GRTD source region (1502), a p-type GRTD source side LDD region (1504), an n-type GRTD source halo region (1506), an n-type channel region (1508), an n-type GRTD drain halo region (1510), a p-type GRTD drain side LDD region (1512) and an n-type GRTD drain region (1514). The n-type GRTD source halo region (1506), n-type channel region (1508) and n-type GRTD drain halo region (1510) form a quantum well between potential barriers formed by the p-type GRTD source side LDD region (1504) and the p-type GRTD drain side LDD region (1512). A quantum well of a desired energy depth is formed by appropriately biasing a GRTD gate with respect to the GRTD source region (1502) such that electron energy levels in the quantum well region are below the conduction band edge (1500) in the GRTD source region (1502). The GRTD drain region (1514) is positively biased with respect to the GRTD source region (1502) to align a populated electron energy level (1518) in the GRTD drain region (1514) with a top electron energy level (1516) in the quantum well region. Electrons in the populated electron energy level (1518) tunnel through the p-type GRTD drain side LDD region (1512) to the top energy level (1516) in the quantum well region, as depicted by the electron tunneling arrow (1520). Electrons (1522) in the top energy level (1516) in the quantum well region (1508) transition to lower energy levels (1524) in the quantum well region, as depicted by the electron transition arrows (1526). A Fermi level (1528) depicts the effect of the drain bias by a slope in the quantum well region.

FIG. 15B depicts a quantum well emptying operation. The bias on the GRTD drain region (1514) is increased so that an unpopulated electron energy level (1530) in the GRTD drain side LDD region (1512) is raised to be substantially equal to the top filled energy level (1532) in the quantum well region. Electrons (1534) in the top filled energy level (1532) tunnel through the p-type GRTD drain side LDD region (1512) to the unpopulated electron energy level (1530), as depicted by the electron tunneling arrow (1536). After the top filled energy level (1532) is emptied, the bias on the GRTD gate is adjusted to reduce an energy depth of the quantum well region, which results in the energy levels in the quantum well region rising with respect to the unpopulated electron energy level (1530), as depicted by energy level transition arrow (1538), until a next populated energy level (1540) in the quantum well region is substantially equal to the unpopulated electron energy level (1530). The steps of emptying an energy level by tunneling through the p-type GRTD drain side LDD region (1512) to the unpopulated electron energy level (1530), and raising the energy levels in the quantum well region (1508) to align a next populated energy level with the unpopulated electron energy level (1530) are repeated until a desired quantity of charge is removed from the quantum well region.

Figure 16:
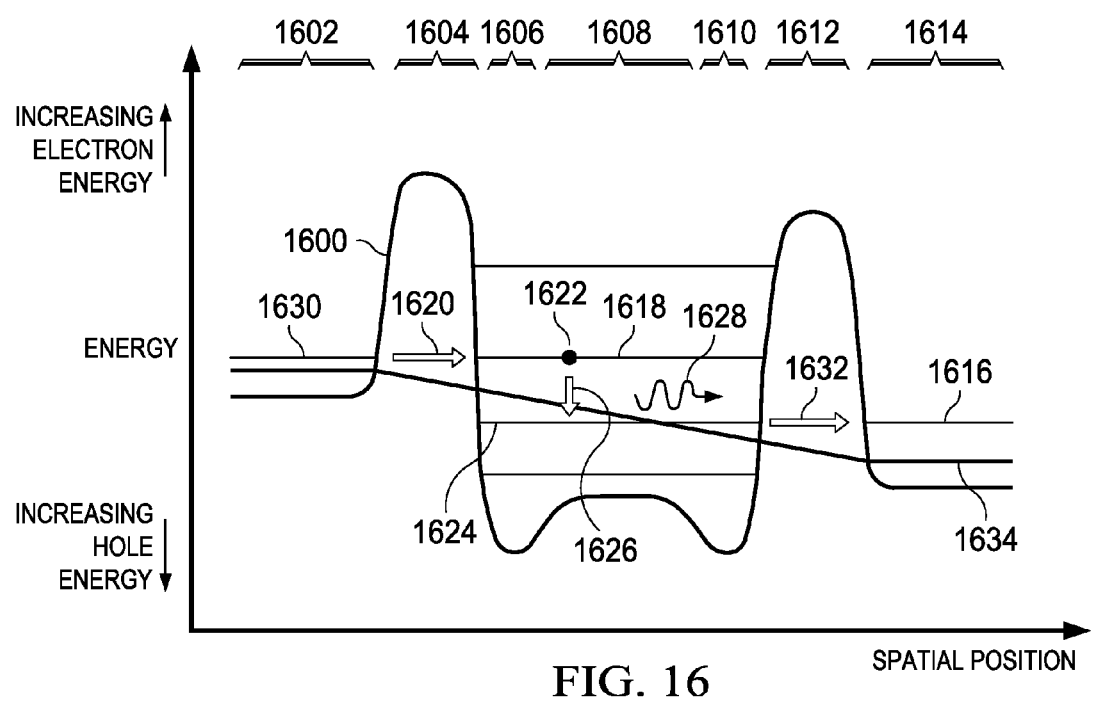
FIG. 16 is a band diagram of GRTD elements as recited in the third embodiment discussed in reference to FIG. 12A through FIG. 12D, depicting operation of the GRTD in a radiative emission mode.

FIG. 16 is a band diagram of GRTD elements as recited in the third embodiment discussed in reference to FIG. 12A through FIG. 12D, depicting operation of the GRTD in a radiative emission mode. A conduction band edge (1600) is plotted through an n-type GRTD source region (1602), a p-type GRTD source side LDD region (1604), an n-type GRTD source halo region (1606), an n-type channel region (1608), an n-type GRTD drain halo region (1610), a p-type GRTD drain side LDD region (1612) and an n-type GRTD drain region (1614). The n-type GRTD source halo region (1606), n-type channel region (1608) and n-type GRTD drain halo region (1610) form a quantum well between potential barriers formed by the p-type GRTD source side LDD region (1604) and the p-type GRTD drain side LDD region (1612). A quantum well with a desired energy depth is formed by appropriately biasing a GRTD gate with respect to the GRTD source region (1602) such that a first electron energy level (1618) in the quantum well region is substantially aligned with a populated electron energy level (1630) in the GRTD source region (1602). The GRTD drain region (1614) is positively biased with respect to the GRTD source region (1602) so that an unpopulated electron energy level (1616) in the GRTD drain region (1614) is substantially aligned to an intermediate energy level (1624) in the quantum well region which is energetically below the first electron energy level (1618). Tunneling of an electron in the GRTD source region (1602) to the first energy level (1618) occurs, as depicted by a first electron tunneling arrow (1620). The electron (1622) in the first energy level (1618) drops to a intermediate energy level (1624) which is lower in energy than the first energy level (1618), as depicted by an electron transition arrow (1626) and desirably emits a photon (1628) which has an energy equal to a difference in energy between the first energy level (1618) and the intermediate energy level (1624). The electron (1622) subsequently tunnels from the intermediate energy level (1624) to an empty drain side energy level (1616) in the GRTD drain region (1614), as depicted by a second electron tunneling arrow (1632). Radiative emission is advantageous in a variety of circuits including sensors and communication circuits. A Fermi level (1634) depicts the effect of the drain bias by a slope in the quantum well region.

Figure 17:
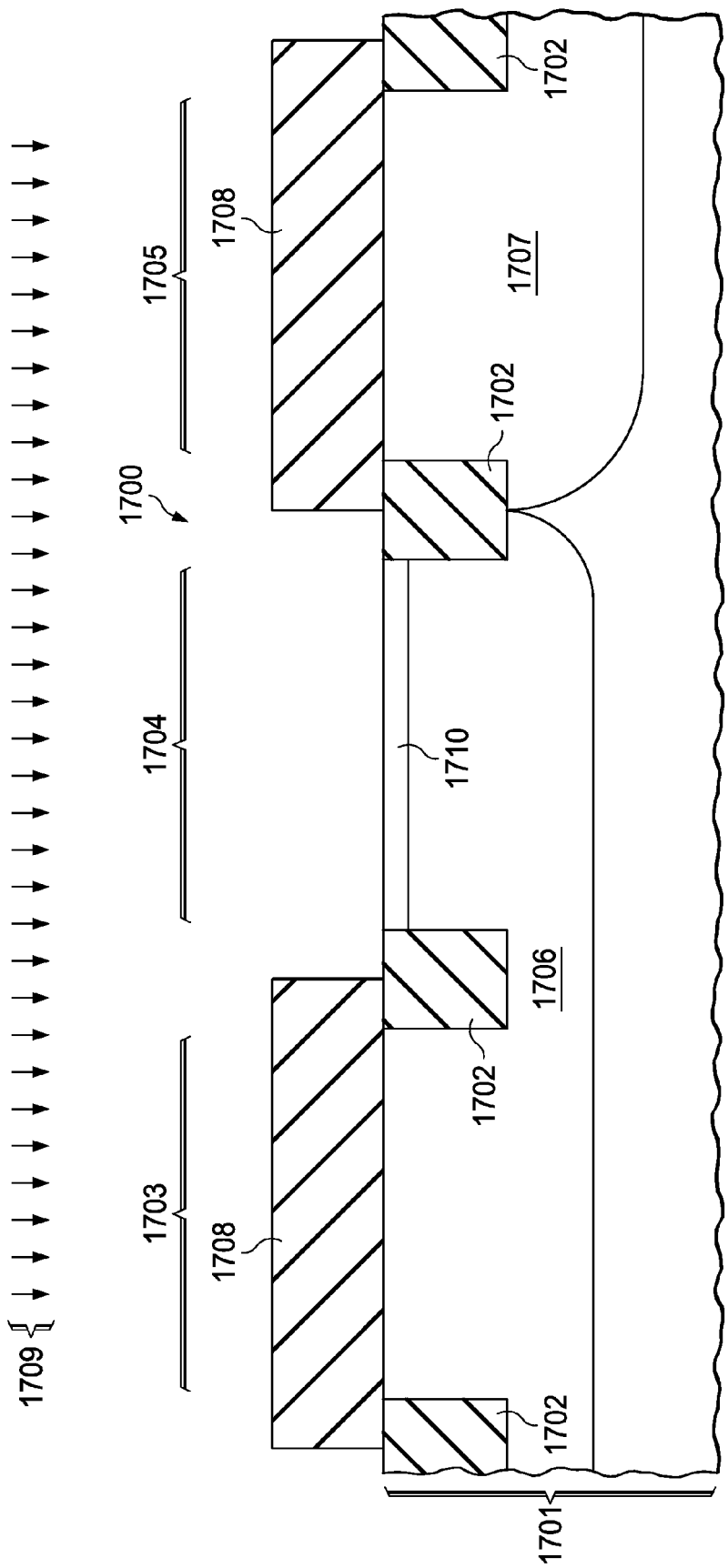
FIG. 17 depicts a process of implanting a reverse polarity threshold set of n-type dopant ions in a GRTD region.

The embodiments discussed above in reference to FIG. 1A through FIG. 1D, FIG. 7A through FIG. 7D and FIG. 12A through FIG. 12D may be improved by implanting a reverse polarity threshold set of n-type dopant ions in a GRTD region, as depicted in FIG. 17. Referring to FIG. 17, an IC (1700) is formed in a substrate (1701) with field oxide elements (1702) separating an NMOS region (1703), a GRTD region (1704) and a PMOS region (1705). A p-well (1706) is formed in the substrate (1701) in the NMOS region (1703) and the GRTD region (1704). An n-well (1707) is formed in the substrate (1701) in the PMOS region (1705). A GRTD reverse threshold photoresist pattern (1708) is formed on a top surface of the substrate (1701) in the NMOS region (1703) and the PMOS region (1705) to expose the GRTD region (1704). A GRTD reverse threshold set of n-type dopant ions, preferably phosphorus, and possibly including arsenic, (1709) is ion implanted into a quantum well region (1710) in a top region of the substrate (1701) in the GRTD region (1704). In a preferred embodiment, a concentration of the GRTD reverse threshold set of n-type dopant ions is high enough to covert the quantum well region (1710) to n-type when fabrication of a GTRD in the GRTD region (1704) has been completed. In a further embodiment, an n-type doping density of the quantum well region (1710) is above $10^{20}$ cm$^{-3}$. Conversion of the quantum well region (1710) to n-type is advantageous because a depth of the quantum well in the GRTD is more than may be achieved with a p-type quantum well region biased into inversion by a GRTD gate.

Figure 18A:
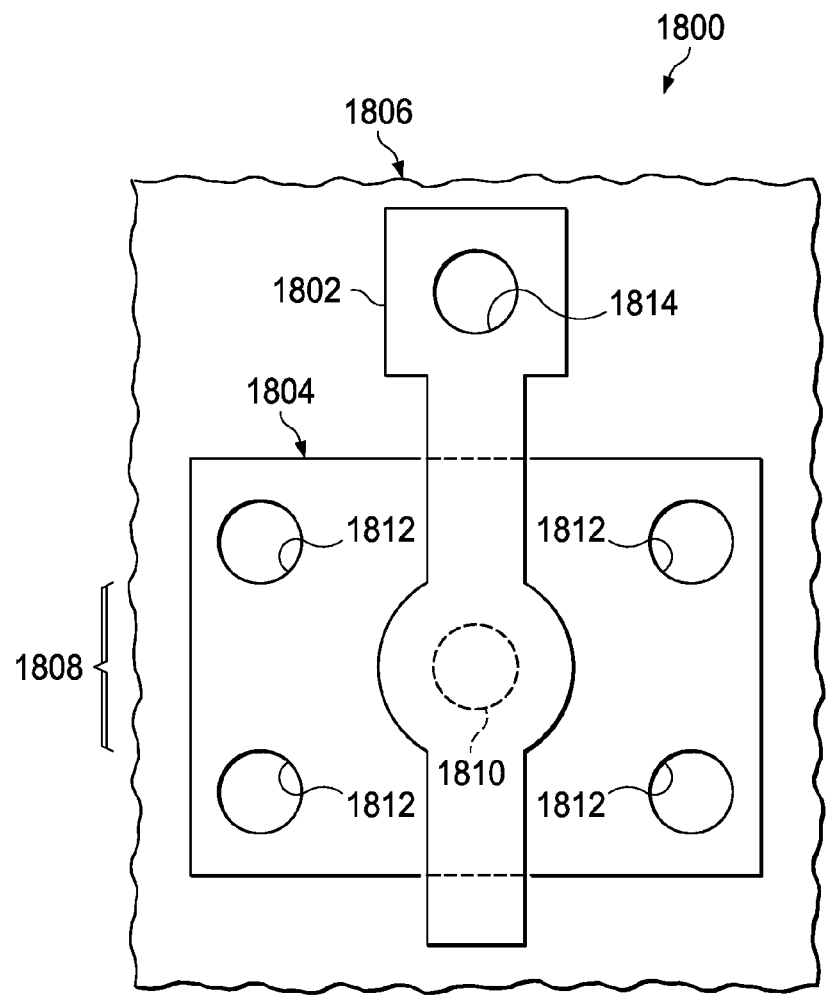
FIG. 18A and FIG. 18B are top views of embodiments of the instant invention, depicting a quantum dot device and a quantum wire device, respectively.
Figure 18B:
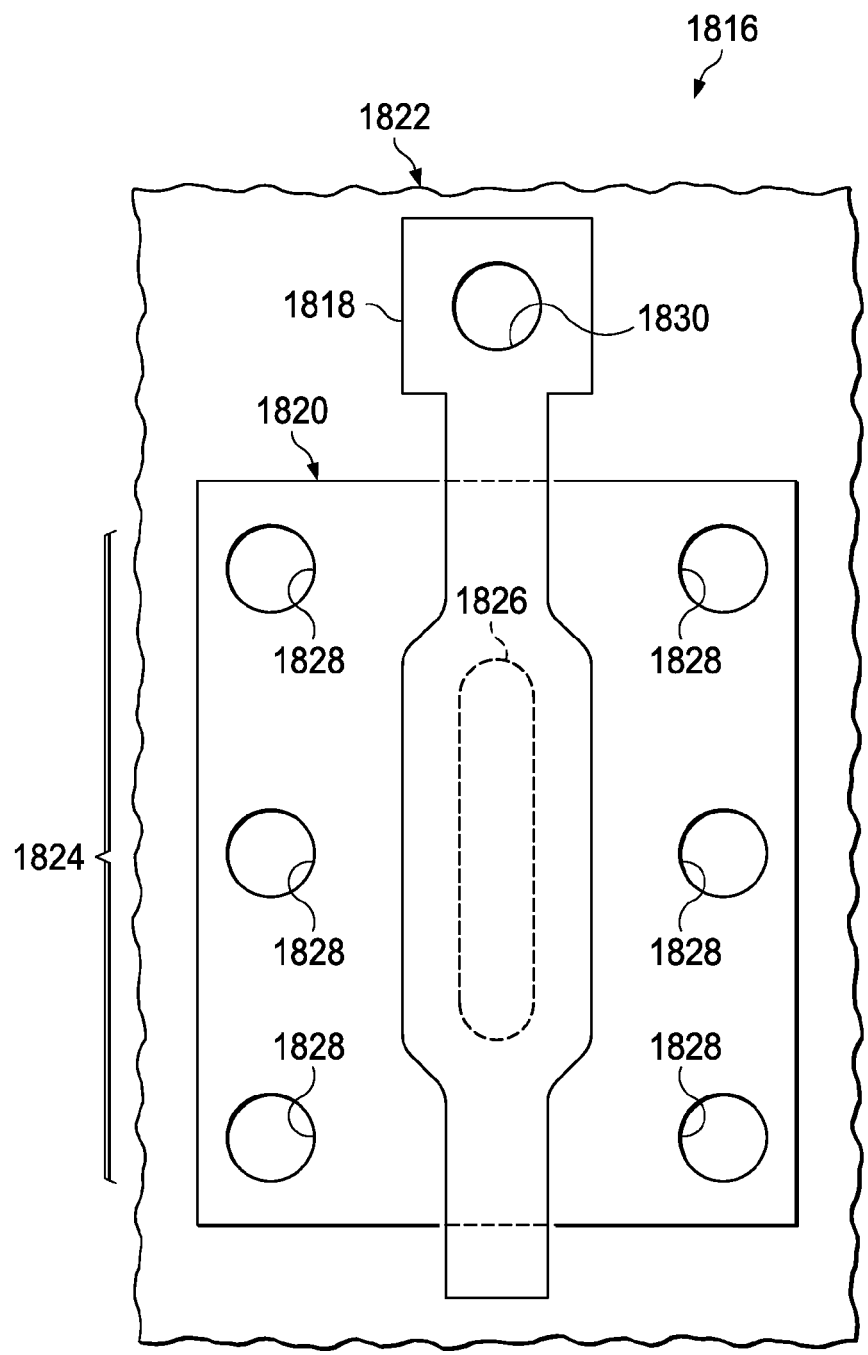

The quantum wells in the embodiments discussed above may be in the form commonly known as quantum dots, in which both lateral dimensions, length and width, are less than 15 nanometers. Other embodiments may have lengths of quantum wells longer than their widths. For example, the quantum wells may be in the form commonly known as quantum wires, in which a width is less than 15 nanometers while a length is significantly longer than 15 nanometers, for example, longer than 50 nanometers. FIG. 18A and FIG. 18B are top views of embodiments of the instant invention, depicting a quantum dot device and a quantum wire device, respectively. Referring to FIG. 18A, the quantum dot device (1800) includes a gate (1802) formed over source/drain regions (1804) and field oxide (1806). Dopants from the source/drain regions (1804) on each side of the gate (1802) extend under the gate (1802) and merge, except in a wide gate region (1808) whose length is substantially equal to its width, resulting in a quantum dot region (1810) under the gate (1802) in which a dopant density is less than $10^{18}$ cm$^{-3}$. A length and a width of the quantum dot region (1810) are substantially equal, and both are preferably less than 15 nanometers. Source/drain contacts (1812) make electrical connections to the source/drain regions (1804) and a gate contact (1814) makes an electrical connection to the gate (1802). A quantum well in the form of a quantum dot with lateral dimensions less than 15 nanometers is advantageous in that energy states in such a quantum dot may be accessed individually at room temperature, and precise amounts of charge may be extracted using circuits with voltage tolerances of a few millivolts. Quantum dots formed with customary CMOS IC fabrication tolerance may be expected to hold equal amounts of charge, facilitating precision circuits such as digital to analog converters.

Referring to FIG. 18B, the quantum wire device (1816) includes a gate (1818) formed over source/drain regions (1820) and field oxide (1822). Dopants from the source/drain regions (1820) on each side of the gate (1818) extend under the gate (1818) and merge, except in a wide gate region (1824) whose length is significantly longer than its width, resulting in a quantum wire region (1826) under the gate (1818) in which a dopant density is less than $10^{18}$ cm$^{-3}$. A length of the quantum wire region (1826) is significantly longer, for example, more than 50 nanometers, than its width, which is preferably less than 15 nanometers. Source/drain contacts (1828) make electrical connections to the source/drain regions (1820) and a gate contact (1830) makes an electrical connection to the gate (1818). A quantum well in the form of a quantum wire is advantageous in that quantum states, for holes or electrons, are distributed in bands containing precise amounts of charge which may be accessed individually at room temperature. A quantum wire is furthermore advantageous because more charge may be stored in a quantum wire configuration per quantum device than in a quantum dot.

Figure 19A:
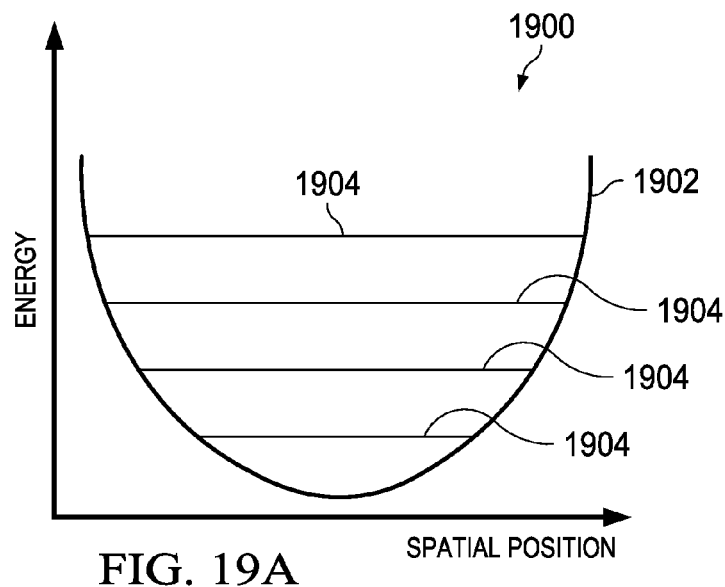
FIG. 19A and FIG. 19B are band diagrams depicting energy levels for a quantum dot and a quantum wire, respectively.

FIG. 19A and FIG. 18B are band diagrams depicting energy levels for a quantum dot and a quantum wire, respectively. Referring to FIG. 19A, a quantum dot band diagram (1900) plots a quantum dot conduction band edge (1902) in a quantum well region as a function of spatial position. The quantum dot quantum well contains several discrete energy levels (1904) which are separated by regions commonly known as forbidden energy gaps. Separation of the discrete energy levels (1904) is a function of dimensions of the quantum dot and a shape of the quantum dot conduction band edge (1902). For example, quantum dots with substantially parabolic shaped quantum wells have substantially equal separations between adjacent energy levels, which is advantageous in some applications. In another example, quantum dots with substantially rectangular shaped quantum wells have increasing separation between energy levels at higher energy values, which is advantageous in other applications. Each discrete energy level (1904) contains two electrons when filled.

Figure 19B:
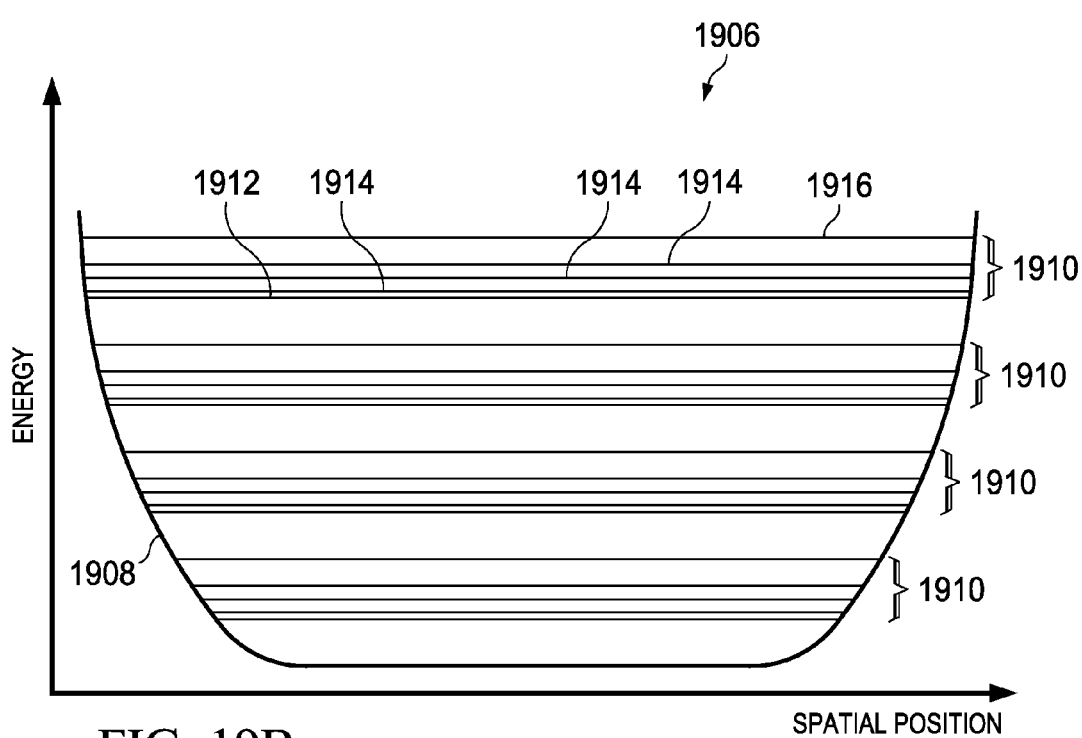

Referring to FIG. 19B, a quantum wire band diagram (1906) plots a quantum wire conduction band edge (1908) in a quantum well region as a function of spatial position. The quantum wire quantum well contains several discrete energy bands (1910) which are separated by forbidden energy gaps. Separation of the discrete energy bands (1910) is a function of a width of the quantum wire, that is, the narrower lateral dimension of the quantum wire, and a shape of the quantum wire conduction band edge (1908) across the width of the quantum wire. For example, quantum wires with substantially parabolic shaped quantum wells across the width dimension have substantially equal separations between adjacent energy levels, which is advantageous in some applications. In another example, quantum wires with substantially rectangular shaped quantum wells across the width dimension have increasing separation between energy levels at higher energy values, which is advantageous in other applications. Within each discrete energy band (1910), there are several discrete energy levels, including a lowest discrete energy level (1912), intermediate discrete energy levels (1914) and a highest discrete energy level (1916). The number of discrete energy levels (1912, 1814, 1816) in each discrete energy band (1910) is a function of a length of the quantum wire. Each discrete energy level (1912, 1814, 1816) contains two electrons when filled. Longer quantum wires generally have more discrete energy levels in each discrete energy band than shorter quantum wires, when all other dimensions and properties are substantially equal.

Those familiar with quantum devices will recognize that the foregoing explanation of the density of electron energy levels in n-type quantum wells may be applied to hole energy levels in p-type quantum wells.

What is claimed is:

1. A gated resonant tunneling diode (GRTD), comprising:
   a p-well formed in a semiconductor substrate;
   a gate dielectric layer formed on a top surface of said p-well;
   a gate formed on a top surface of said gate dielectric layer;
   an n-type source region formed in said p-well adjacent to said gate;
   an n-type drain region formed in said p-well adjacent to said gate opposite from said source region;
   an n-type quantum well formed in said p-well under said gate;
   a p-type source electron barrier region formed in said p-well between said quantum well and said source region; and
   a p-type drain electron barrier region formed in said p-well between said quantum well and said drain region.

2. The gated resonant tunneling diode of claim 1, further comprising:
   an n-type source lightly doped drain (LDD) region formed in said p-well between said source region and said source electron barrier region; and
   an n-type drain LDD region formed in said p-well between said drain region and said drain electron barrier region.

3. The gated resonant tunneling diode of claim 1, in which:
   said p-type source electron barrier region is more than 20 nanometers wide; and
   said p-type drain electron barrier region is more than 20 nanometers wide.

4. The gated resonant tunneling diode of claim 1, in which:
   said quantum well further comprises:
      a first n-type implanted region formed in said p-well under said gate adjacent to said p-type source electron barrier region; and
      a second n-type implanted region formed in said p-well under said gate adjacent to said p-type source electron barrier region;
   said p-type source electron barrier region is more than 20 nanometers wide; and
   said p-type drain electron barrier region is more than 20 nanometers wide.

5. The gated resonant tunneling diode of claim 1, further comprising an n-type implanted region formed in said p-well under said gate dielectric layer.

6. The gated resonant tunneling diode of claim 1, in which:
   a width of said quantum well is less than 15 nanometers; and
   a length of said quantum well is less than 15 nanometers.

7. The gated resonant tunneling diode of claim 1, in which:
   a width of said quantum well is less than 15 nanometers; and
   a length of said quantum well is more than 50 nanometers.

8. A method of forming a gated resonant tunneling diode (GRTD), comprising the steps of:
   forming a p-well in a semiconductor substrate by a process of ion implanting p-type dopants;
   forming a gate dielectric layer on a top surface of said p-well;
   forming a gate on a top surface of said gate dielectric layer;
   forming an n-type source region in said p-well adjacent to said gate by a process of ion implanting n-type dopants;
   forming an n-type drain region in said p-well adjacent to said gate opposite from said source region by a process of ion implanting n-type dopants;
   forming an n-type quantum well in said p-well under said gate;
   forming a p-type source electron barrier region in said p-well between said quantum well and said source region by a process of ion implanting p-type dopants; and
   forming a p-type drain electron barrier region in said p-well between said quantum well and said drain region by a process of ion implanting p-type dopants.

9. The method of claim 8, further comprising the steps of:
   forming an n-type source lightly doped drain (LDD) region in said p-well between said source region and said source electron barrier region by a process of ion implanting n-type dopants; and
   forming an n-type drain LDD region in said p-well between said drain region and said drain electron barrier region by a process of ion implanting n-type dopants.

10. The method of claim 8, in which:
    said p-type source electron barrier region is formed to be more than 20 nanometers wide; and
    said p-type drain electron barrier region is formed to be more than 20 nanometers wide.

11. The method of claim 8, in which:
    said step of forming a quantum well further comprises the steps of:
       forming a first n-type implanted region formed in said p-well under said gate adjacent to said p-type source electron barrier region by a process of ion implanting n-type dopants; and
       forming a second n-type implanted region in said p-well under said gate adjacent to said p-type source electron barrier region by a process of ion implanting n-type dopants;
    said p-type source electron barrier region is formed to be more than 20 nanometers wide; and
    said p-type drain electron barrier region is formed to be more than 20 nanometers wide.

12. The method of claim 8, further comprising the step of forming an n-type implanted region in said p-well under said gate dielectric layer by a process of ion implanting n-type dopants.

13. The method of claim 8, in which:
said quantum well is formed such that a width of said quantum well is less than 15 nanometers; and
said quantum well is formed such that a length of said quantum well is less than 15 nanometers.

14. The method of claim 8, in which:
said quantum well is formed such that a width of said quantum well is less than 15 nanometers; and
said quantum well is formed such that a length of said quantum well is more than 50 nanometers.

15. A method of operating a gated resonant tunneling diode, comprising the steps of:
providing a p-well formed in a semiconductor substrate;
providing a gate dielectric layer formed on a top surface of said p-well;
providing a gate formed on a top surface of said gate dielectric layer;
providing an n-type source region formed in said p-well adjacent to said gate;
providing an n-type drain region formed in said p-well adjacent to said gate opposite from said source region;
providing a p-type source electron barrier region formed in said p-well between said quantum well and said source region; and
providing a p-type drain electron barrier region formed in said p-well between said quantum well and said drain region;
applying a ground potential to said p-well; and
applying a positive potential to said gate with respect to said ground potential, so as to form an n-type quantum well which contains discrete electron energy levels, in said p-well under said gate.

16. The method of claim 15, further comprising the steps of:
applying said ground potential to said source region of said gated resonant tunneling diode; and
applying a negative potential to said drain region of said gated resonant tunneling diode with respect to said ground potential, so as to align a populated electron energy level in said drain region with one of said discrete electron energy levels in said quantum well, resulting in electrons in said populated electron energy level in said drain region tunneling through said p-type drain electron barrier region to said discrete electron energy level in said quantum well and further tunneling through said p-type source electron barrier region to an unpopulated electron energy level in said source region.

17. The method of claim 15, further comprising the steps of:
filling said discrete electron energy levels in said quantum well with electrons, by a process further comprising the steps of:
applying a negative potential to said source region of said gated resonant tunneling diode with respect to said ground potential so that a conduction band edge in said source region is higher than a top discrete electron energy level in said quantum well; and applying a negative potential to said drain region of said gated resonant tunneling diode with respect to said ground potential, so as to align a populated electron energy level in said drain region with one of said discrete electron energy levels in said quantum well, resulting in electrons in said populated electron energy level in said drain region tunneling through said p-type drain electron barrier region to said discrete electron energy level in said quantum well until said discrete electron energy levels below said populated electron energy level in said drain region are filled with electrons; and
emptying said discrete electron energy levels in said quantum well of electrons, by a process further comprising the steps of:
applying a negative potential to said source region of said gated resonant tunneling diode with respect to said ground potential so that a conduction band edge in said source region is higher than a top discrete electron energy level in said quantum well;
applying a negative potential to said drain region of said gated resonant tunneling diode with respect to said ground potential, so as to align an unpopulated electron energy level in said drain region with a first filled electron energy level in said quantum well, resulting in electrons in said discrete electron energy levels above said first filled electron energy level tunneling through said p-type drain electron barrier region to said populated electron energy level in said drain region; and
applying a less negative potential to said drain region of said gated resonant tunneling diode with respect to said ground potential, so as to align said unpopulated electron energy level in said drain region with a second filled electron energy level in said quantum well, resulting in electrons in said discrete electron energy levels above said second filled electron energy level tunneling through said p-type drain electron barrier region to said populated electron energy level in said drain region.

18. The method of claim 15, further comprising the steps of:
applying said ground potential to said source region of said gated resonant tunneling diode; and
applying a negative potential to said drain region of said gated resonant tunneling diode with respect to said ground potential, so as to align a populated electron energy level in said drain region with one of said discrete electron energy levels in said quantum well, resulting in electrons in said populated electron energy level in said drain region tunneling through said p-type drain electron barrier region to said discrete electron energy level in said quantum well, transitioning to a lower discrete electron energy level in said quantum well while emitting a photon, and further tunneling through said p-type source electron barrier region to an unpopulated electron energy level in said source region.

* * * * *